(12) United States Patent
Chae et al.

(10) Patent No.: US 8,358,535 B2
(45) Date of Patent: Jan. 22, 2013

(54) SEMICONDUCTOR DEVICE INCLUDING SUB WORD LINE DRIVER

(75) Inventors: Kyo-suk Chae, Suwon-si (KR); Satoru Yamada, Seoul (KR); Hyuk-joon Kwon, Yongin-si (KR); Won-kyung Park, Seoul (KR); Hyoung-ho Ko, Cheonan-si (KR)

(73) Assignee: Samsung Electronics Co., Ltd., Suwon-Si, Gyeongg-Do (KR)

( * ) Notice: Subject to any disclaimer, the term of this patent is extended or adjusted under 35 U.S.C. 154(b) by 190 days.

(21) Appl. No.: 12/911,368

(22) Filed: Oct. 25, 2010

(65) Prior Publication Data

US 2011/0170344 A1 Jul. 14, 2011

(30) Foreign Application Priority Data

Jan. 13, 2010 (KR) .................. 10-2010-0003131

(51) Int. Cl.
*G11C 11/34* (2006.01)
(52) U.S. Cl. .................. 365/182; 365/230.04; 365/191; 365/104

(58) Field of Classification Search .................. 365/182, 365/230.04, 191, 104
See application file for complete search history.

(56) References Cited

U.S. PATENT DOCUMENTS

2010/0157716 A1* 6/2010 Lee .................. 365/230.06

FOREIGN PATENT DOCUMENTS

| JP | 2008-022349 | 1/2008 |
|---|---|---|
| JP | 2008-112513 | 5/2008 |
| KR | 1020010004535 | 1/2001 |

* cited by examiner

*Primary Examiner* — Thong Q Le
(74) *Attorney, Agent, or Firm* — F. Chau & Associates, LLC

(57) ABSTRACT

A semiconductor device includes a sub word line driver. A first sub word line and a second sub word line transmit an operation signal to a memory cell. A main word line optionally sends the operation signal to the first sub word line and the second sub word line. A switching transistor is disposed between the first sub word line and the second sub word line. A gate of the switching transistor is connected the main word line.

18 Claims, 19 Drawing Sheets

SEMICONDUCTOR DEVICE INCLUDING SUB WORD LINE DRIVER

CROSS-REFERENCE TO RELATED APPLICATION

This application claims priority to and the benefit of Korean Patent Application No. 10-2010-0003131, filed on Jan. 13, 2010, in the Korean Intellectual Property Office, the entire content of which is incorporated by reference herein.

BACKGROUND

The present disclosure relates to semiconductor devices, and more particularly, to a semiconductor device including a sub word line driver.

In general, a semiconductor memory device has a plurality of word lines that are formed of a material having relatively high resistance such as polysilicon or polycide. Thus, if an operating voltage is transmitted to a memory cell that is distant from a row decoder while reading or storing data, a delay that is proportional to the multiplication of a capacitance of a word line with a resistance, i.e., RC delay, occurs to reduce the speed of a semiconductor device.

SUMMARY

In accordance with an exemplary embodiment of the present inventive concept, a semiconductor device having a hierarchical word line structure using a sub word line driver is provided.

According to an exemplary embodiment, a semiconductor device includes a first sub word line and a second sub word line, each of which transmits an operation signal to a memory cell, a main word line that alternately sends the operation signal to either the first sub word line or the second sub word line, and a switching transistor disposed between the first sub word line and the second sub word line. A gate of the switching transistor is connected to the main word line.

The semiconductor device may further include a first N-type transistor disposed between the first sub word line and a ground, and a second N-type transistor disposed between the second sub word line and the ground. The gates of the first N-type transistor and the second N-type transistor may be connected to the main word line.

The first N-type transistor, the second N-type transistor and the switching transistor may be formed in a rectangular active region.

The first N-type transistor, the second N-type transistor and the switching transistor may be formed in a U-shaped active region.

According to an exemplary embodiment a semiconductor device includes a first P-type transistor having one end connected to a first selection signal receiving unit, a second P-type transistor having one end connected to a second selection signal receiving unit, a first N-type transistor and a second N-type transistor respectively having one end connected to a ground, a first sub word line having one end connected to other ends of the first P-type transistor and the first N-type transistor, a second sub word line having one end connected to other ends of the second P-type transistor and the second N-type transistor, a first switching transistor disposed between the first sub word line and the second sub word line, and a first main word line connected to gates of the first N-type transistor, of the second N-type transistor, of the first P-type transistor, of the second P-type transistor, and of the first switching transistor.

The first N-type transistor, the second N-type transistor and the first switching transistor may be formed in a rectangular active region.

The first N-type transistor, the second N-type transistor and the first switching transistor may be formed in a U-shaped active region.

A first N-type inhibitory transistor may be disposed between the first sub word line and the ground, and a second N-type inhibitory transistor may be disposed between the second sub word line and the ground.

A third P-type transistor may have one end connected to a third selection signal receiving unit. A fourth P-type transistor may have one end connected to a fourth selection signal receiving unit. A third N-type transistor and a fourth N-type transistor may respectively have one end connected to the ground. A third sub word line may have one end connected to other ends of the third P-type transistor and the third N-type transistor. A fourth sub word line may have one end connected to other ends of the fourth P-type transistor and the fourth N-type transistor. A second switching transistor may be disposed between the third sub word line and the fourth sub word line. A second main word line may be connected to gates of the third N-type transistor, of the fourth N-type transistor, of the third P-type transistor, of the fourth P-type transistor, and of the second switching transistor.

The first N-type transistor, the second N-type transistor, the third N-type transistor, the fourth N-type transistor, the first switching transistor and the second switching transistor may be formed in a rectangular active region.

The first N-type transistor, the second N-type transistor, the third N-type transistor, the fourth N-type transistor, the first switching transistor and the second switching transistor may be formed in an H-shaped active region.

The semiconductor device may further include a first decoder that receives a first strobe signal and that alternately sends an operation signal to either the first main word line or the second main word line.

The semiconductor device may further include a first selection line connected to the first selection signal receiving unit and the third selection signal receiving unit, a second selection line connected to the second selection signal receiving unit and the fourth selection signal receiving unit, and a second decoder that receives a second strobe signal and that alternately sends a selection signal to either the first selection line or the second selection line.

According to an exemplary embodiment a semiconductor device includes a rectangular active region formed on a semiconductor substrate and defined by a device isolation region, a first access region and a second access region respectively formed at both corners of a first side surface of the semiconductor substrate, a third access region spaced apart from the first access region and the second access region and formed between both corners of a second side surface of the semiconductor substrate opposite to the first side surface, and a channel region between the first access region, the second access region and the third access region.

The semiconductor device may further include a device isolation region that extends from the first side surface toward the second side surface by a predetermined thickness.

According to an exemplary embodiment a semiconductor device includes a rectangular active region formed on a semiconductor substrate and defined by a device isolation region, a first access region and a second access region respectively formed at both corners of a first side surface of the semiconductor substrate, a third access region and a fourth access region respectively formed at both corners of a second side surface of the semiconductor substrate opposite to the first side surface, an integrated access region spaced apart from the first access region, from the second access region, from the third access region, from the fourth access region and formed between two side surfaces of the active region perpendicular to the first and second side surfaces, a first channel region between the first access region, the second access region and the integrated access region, and a second channel region between the third access region, the fourth access region and the integrated access region.

The semiconductor device may further include a device isolation region that extends from one of the first side surface and second side surface toward an other of the first side surface and second side surface by a predetermined thickness.

According to an exemplary embodiment a semiconductor device includes a first semiconductor substrate having a rectangular parallelepiped shape and having a first side surface, a second side surface opposite to the first side surface, a third side surface perpendicular to the first side surface, and a fourth side surface opposite to the third side surface, a first channel region formed from the first side surface into the first semiconductor substrate, a second channel region formed from the second side surface into the first semiconductor substrate, a third access region formed from the third side surface into the first semiconductor substrate, a first access region formed into the first semiconductor substrate from a vertex of the first semiconductor substrate disposed between the first channel region and the third channel region, a second access region formed into the first semiconductor substrate from a vertex of the first semiconductor substrate disposed between the second channel region and the third channel region, a third channel region formed into the first semiconductor substrate from the fourth side surface, a first sub word line disposed on the first access region, a second sub word line disposed on the second access region, a first ground disposed on the third access region, and a first gate disposed between the first sub word line, the second sub word line, and the first ground.

The semiconductor device may further include a second semiconductor substrate having a rectangular parallelepiped shape and having a fifth side surface, a sixth side surface opposite to the fifth side surface, a seventh side surface perpendicular to the sixth side surface, and an eighth side surface opposite to the seventh side surface, a fourth channel region formed from the fifth side surface into the second semiconductor substrate, a fifth channel region formed from the sixth side surface into the second semiconductor substrate, a sixth channel region formed from the seventh side surface into the second semiconductor substrate, a fourth access region formed into the second semiconductor substrate from a vertex of the second semiconductor substrate disposed between the fourth channel region and the sixth channel region, a fifth access region formed into the second semiconductor substrate from a vertex of the second semiconductor substrate disposed between the fifth channel region and the sixth channel region, a sixth access region formed into the second semiconductor substrate from the eighth side surface, a third sub word line disposed on the fourth access region, a fourth sub word line disposed on the fifth access region, a second ground disposed on the sixth access region, and a second gate disposed between the third sub word line, the fourth sub word line, and the second ground. The fourth side surface of the first semiconductor substrate directly contacts the eighth side surface of the second semiconductor substrate.

The first gate, the first channel region, the first access region, and the third access region may form a first N-type transistor. The first gate, the second channel region, the second access region, and the third access region may form a second N-type transistor. The first gate, the third channel region, the first access region, and the second access region may form a first switching transistor. The second gate, the fourth channel region, the fourth access region, and the sixth access region may form a third N-type transistor. The second gate, the fifth channel region, the fifth access region, and the sixth access region may form a fourth N-type transistor. The second gate, the sixth channel region, the fourth access region, and the fifth access region may form a second switching transistor. A switching current of the first switching transistor may be changed according to the doping concentration of an impurity of the third channel region. A switching current of the second switching transistor may be changed according to the doping concentration of an impurity of the sixth channel region.

According to an exemplary embodiment a semiconductor device for coupling a signal from a word line to either of a first sub word line or a second sub word line includes a first N-type transistor having a first N-type transistor drain region formed on a semiconductor substrate, a second N-type transistor having a second N-type transistor drain region formed on the semiconductor substrate, an N-type transistor source region formed on the semiconductor substrate, common both to the first N-type transistor and to the second N-type transistor and coupled to ground, a switching transistor having one of a switching transistor source or drain formed by the first N-type transistor drain region and an other of the switching transistor source or drain formed by the second N-type drain transistor region, an N-type transistor gate region formed between the first N-type transistor drain region, the second N-type transistor drain region and the N-type transistor source region and common to the first N-type transistor, to the second N-type transistor and to the switching transistor. The first sub word line is on the first N-type transistor drain region. The second sub word line on the second N-type transistor drain region. A signal applied to the N-type transistor gate region is selectively coupleable to the first word line or to the second word line.

According to an exemplary embodiment a semiconductor device for coupling signals from a first word line to either of a first sub word line or a second sub word line or from a second word line to either of a third sub word line or a fourth sub word line includes a first N-type transistor having a first N-type transistor drain region formed on a semiconductor substrate, a second N-type transistor having a second N-type transistor drain region formed on the semiconductor substrate, a third N-type transistor having a third N-type transistor drain region formed on a semiconductor substrate, a fourth N-type transistor having a fourth N-type transistor drain region formed on the semiconductor substrate, an N-type transistor source region formed on the semiconductor substrate, common to the first N-type transistor, to the second N-type transistor, to the third N-type transistor, and to the fourth N-type transistor, and coupled to ground, a first switching transistor having one of a first switching transistor source or drain formed by the first N-type transistor drain region and an other of the first switching transistor source or drain formed by the second N-type drain transistor region, a second switching transistor having one of a second switching transistor source or drain formed by the third N-type transistor drain region and an other of the second switching transistor source or drain formed by the fourth N-type drain transistor region, a first N-type transistor gate region formed between the first N-type transistor drain region, the second N-type transistor drain region and the N-type transistor source region and common to the first N-type transistor, to the second N-type transistor and to the first switching transistor, and a second N-type transistor gate region formed between the third N-type transistor drain region, the fourth N-type transistor drain region and the N-type transistor source region and common to the third N-type transistor, to the fourth N-type transistor and to the second switching transistor. The first sub word line is on the first N-type transistor drain region. The second sub word line is on the second N-type transistor drain region. The third sub word line is on the third N-type transistor drain region and the fourth sub word line is on the fourth N-type transistor drain region. A signal applied to the first N-type transistor gate region is selectively coupleable to the first sub word line or to the second sub word line, and a signal applied to the second N-type gate region is selectively coupleable to the third sub word line or to the fourth sub word line.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Hereinafter, the exemplary embodiments of the inventive concept will be described in detail with reference to the attached drawings.

In the present description, terms, such as first, second, and the like, are used to describe various members, components, regions, layers, and/or portions. However, it would be apparent to one of ordinary skill in the art that the elements, components, areas, layers, and/or parts are not limited by these terms. The terms are used only for distinguishing one member, component, region, layer, or portion from another member, component, region, layer, or portion. Thus, a first member, region, layer, or portion which will be described may also refer to a second member, component, region, layer, or portion.

Figure 1:
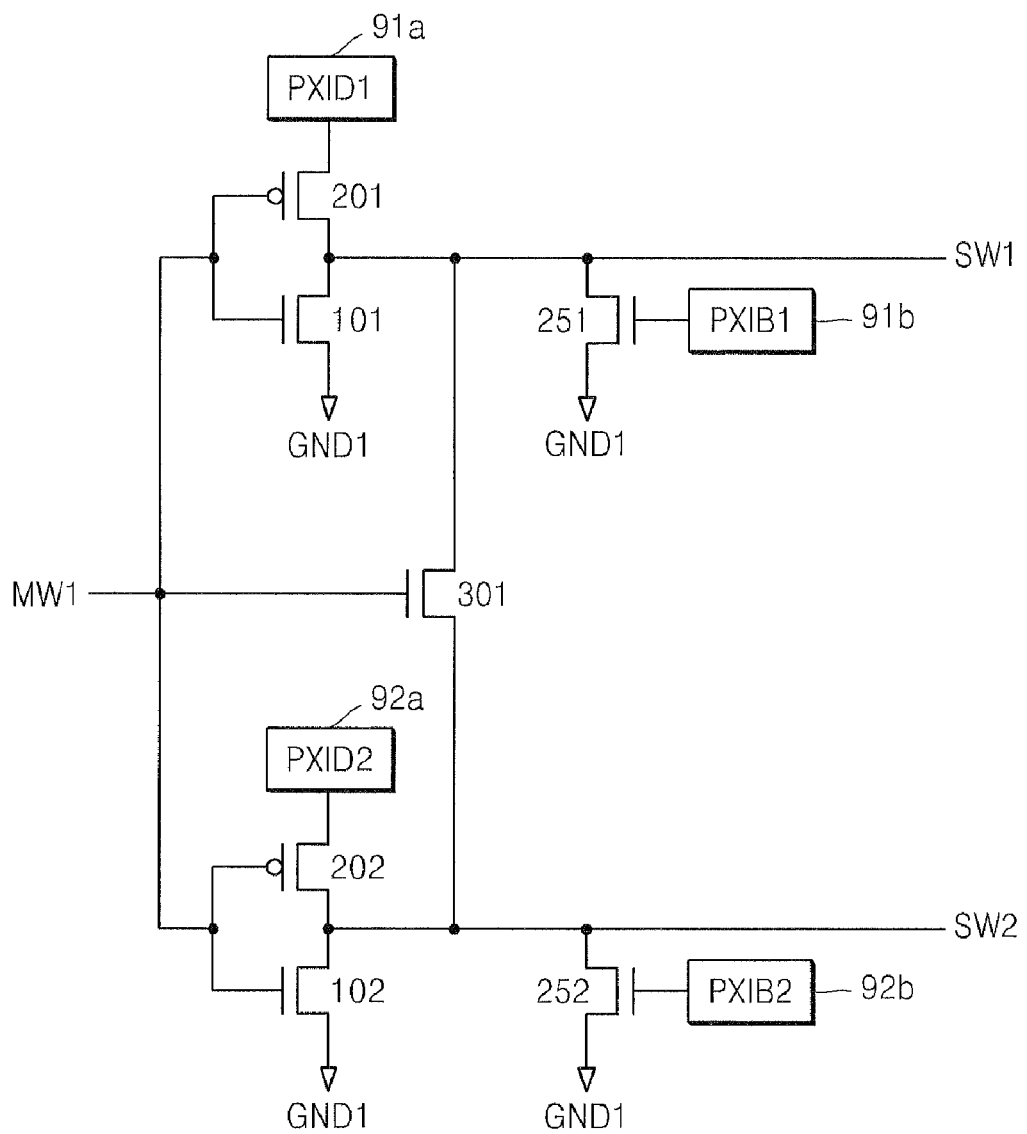
FIG. 1 is a circuit diagram schematically illustrating a semiconductor device including a sub word line driver according to an exemplary embodiment of the inventive concept.
Figure 2:
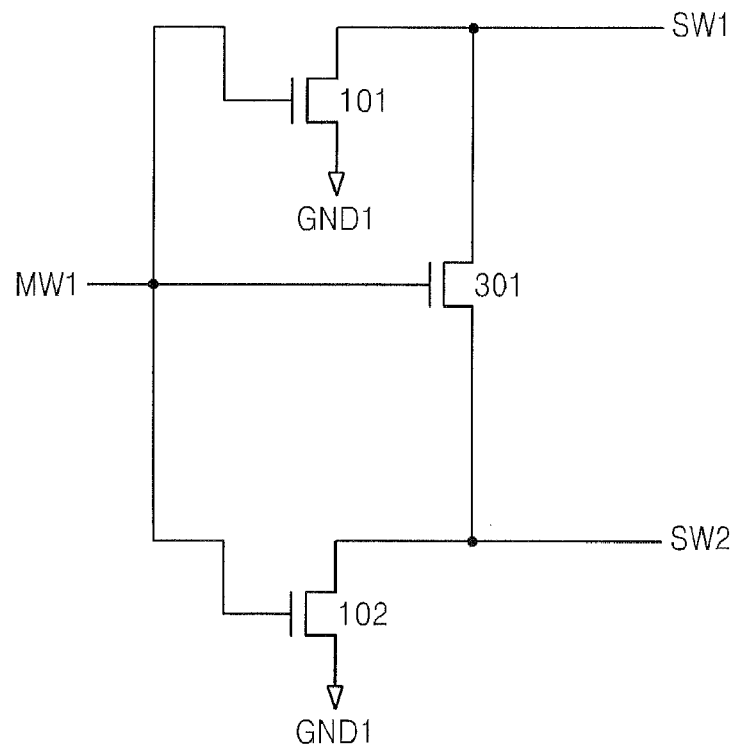
FIG. 2 is a circuit diagram illustrating first and second N-type transistors and a first switching transistor of the semiconductor device of FIG. 1.
Figure 3:
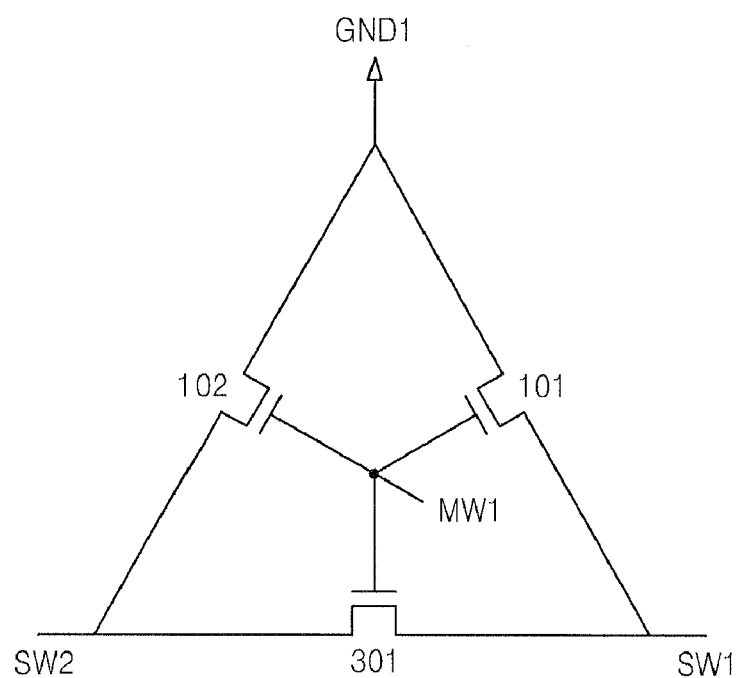
FIG. 3 is a circuit diagram, substantially the same as the circuit diagram of FIG. 2, illustrating an exemplary layout of the first and second N-type transistors and the first switching transistor of FIG. 2.

FIG. 1 is a circuit diagram schematically illustrating a semiconductor device including a sub word line driver according to an exemplary embodiment of the inventive concept. FIG. 2 is a circuit diagram illustrating first N-type transistor 101, second N-type transistor 102 and a first switching transistor 301 of the semiconductor device of FIG. 1. FIG. 3 is a circuit diagram, substantially the same as the circuit diagram of FIG. 2, illustrating an exemplary layout of the first and second N-type transistors 101, 102 and the first switching transistor 301 of FIG. 2.

Referring to FIGS. 1 to 3, a semiconductor device includes a first P-type transistor 201, a second P-type transistor 202, first and second N-type transistors 101, 102, a first sub word line SW1, a second sub word line SW2, first switching transistor 301, and a first main word line MW1.

One end of the first P-type transistor 201 may be connected to a first selection signal receiving unit 91a, and the other end of the first P-type transistor 201 may be connected to the first sub word line SW1. A gate of the first P-type transistor 201 may be connected to the first main word line MW1. One end of the second P-type transistor 202 may be connected to a second selection signal receiving unit 92a, and the other end of the second P-type transistor 202 may be connected to the second sub word line SW2. A gate of the second P-type transistor 202 may be connected to the first main word line MW1.

One end of the first N-type transistor 101 may be connected to a first ground GND1, and the other end of the first N-type transistor 101 may be connected to the first sub word line SW1. A gate of the first N-type transistor 101 may be connected to the first main word line MW1. One end of the second N-type transistor 102 may be connected to the first ground GND1, and the other end of the second N-type transistor 102 may be connected to the second sub word line SW2.

A gate of the second N-type transistor 102 may be connected to the first main word line MW1.

The first sub word line SW1 and the second sub word line SW2 may send an operation signal to a memory cell (not shown). The first sub word line SW1 may have one end connected to the other ends of the first P-type transistor 201 and the first N-type transistor 101. The second sub word line SW2 may have one end connected to the other ends of the second P-type transistor 202 and the second N-type transistor 102.

Ends of the first switching transistor 301 may be connected to the first sub word line SW1 and the second sub word line SW2, respectively. A gate of the first switching transistor 301 may be connected to the first main word line MW1.

The first main word line MW1 may receive an operation signal and alternately send the operation signal to either the first sub word line SW1 or the second sub word line SW2. The first main word line MW1 may be connected to gates of the first and second N-type transistors 101, 102, the first and second P-type transistors 201, 202, and the first switching transistor 301.

The semiconductor device may further include a first N-type inhibitory transistor 251 that is disposed between the first sub word line SW1 and the first ground GND1 and a second N-type inhibitory transistor 252 that is disposed between the second sub word line SW2 and a second ground GND2. A gate of the first N-type inhibitory transistor 251 may be connected to a first selection bar signal receiving unit 91b and receive a signal that is complementary to the first selection signal received from the first selection signal receiving unit 91a. A gate of the second N-type inhibitory transistor 252 may be connected to a second selection bar signal receiving unit 92b and receive a signal that is complementary to the second selection signal received by the second selection signal receiving unit 92a.

Figure 4:
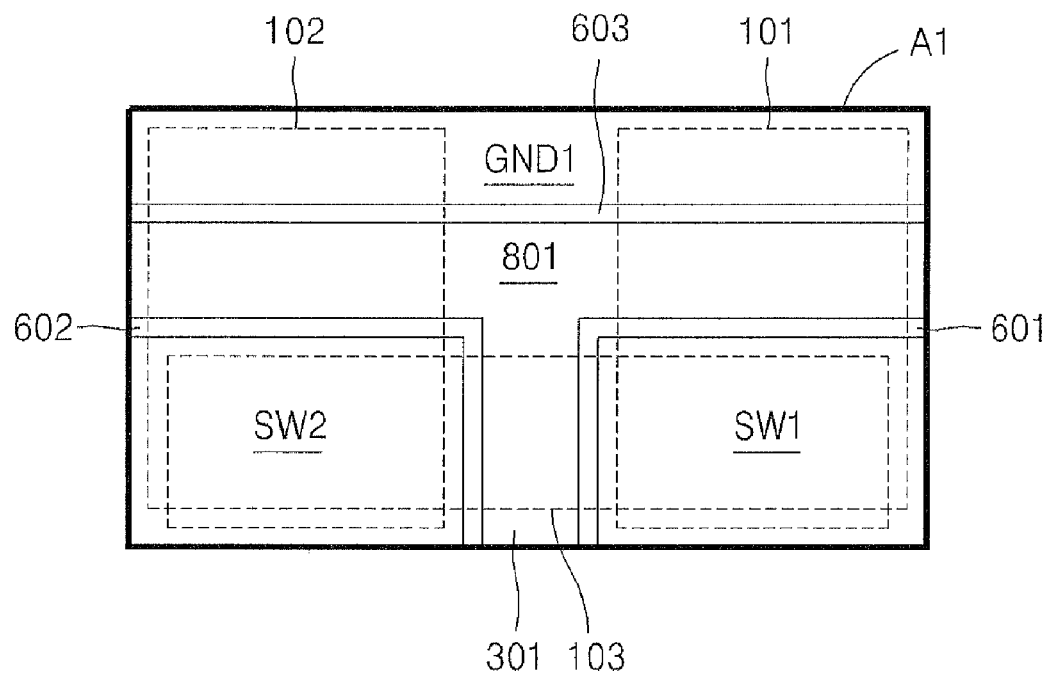
FIG. 4 illustrates a schematic layout of a semiconductor device including a sub word line driver according to an exemplary embodiment of the inventive concept.

FIG. 4 schematically illustrates a layout of a semiconductor device including a sub word line driver according to an exemplary embodiment of the inventive concept. This layout of the semiconductor device according to the present exemplary embodiment shows a circuit diagram illustrating the first and second N-type transistors 101, 102 and the first switching transistor 301 of FIG. 3.

Referring to FIG. 4, the first and second N-type transistors 101, 102 and the first switching transistor 301 may be formed in a rectangular active region A1. In particular, the first N-type transistor 101 including a first gate 801 may be disposed between the first sub word line SW1 and the first ground GND1. The second N-type transistor 102 including a first gate 801 may be disposed between the second sub word line SW2 and the first ground GND1. The first switching transistor 301 including the first gate 801 may be disposed between the first sub word line SW1 and the second sub word line SW2. The first gate 801 may be electrically connected to a first word line (not shown).

Figure 5:
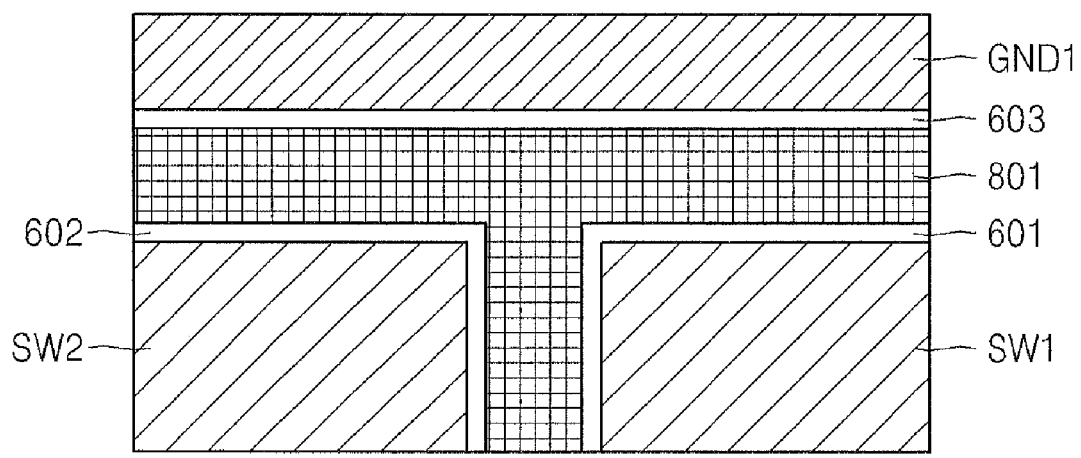
FIGS. 5 and 6 respectively illustrate a top plan view and a perspective view of a semiconductor device including a sub word line driver according to an exemplary embodiment of the inventive concept.
Figure 6:
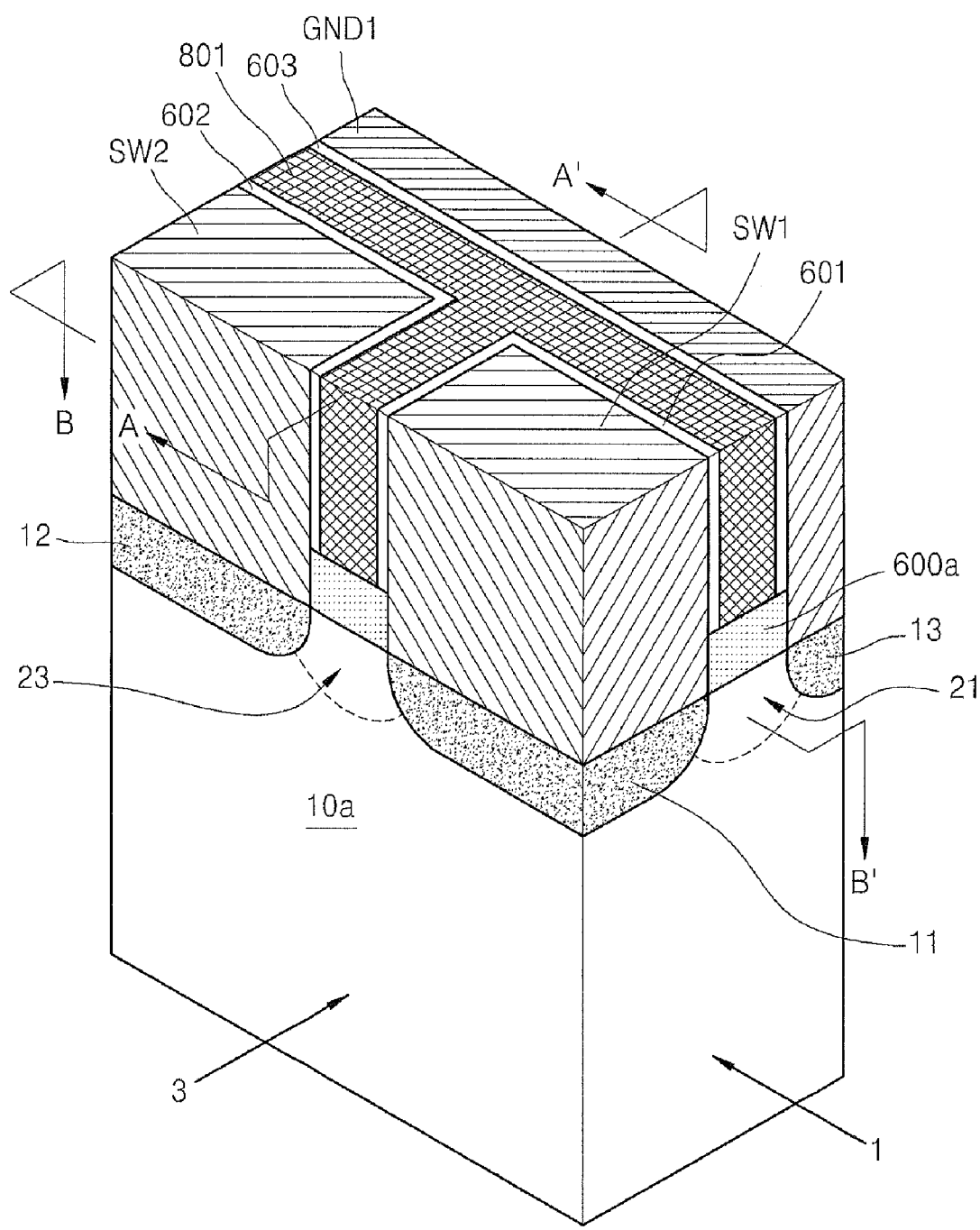
Figure 7:
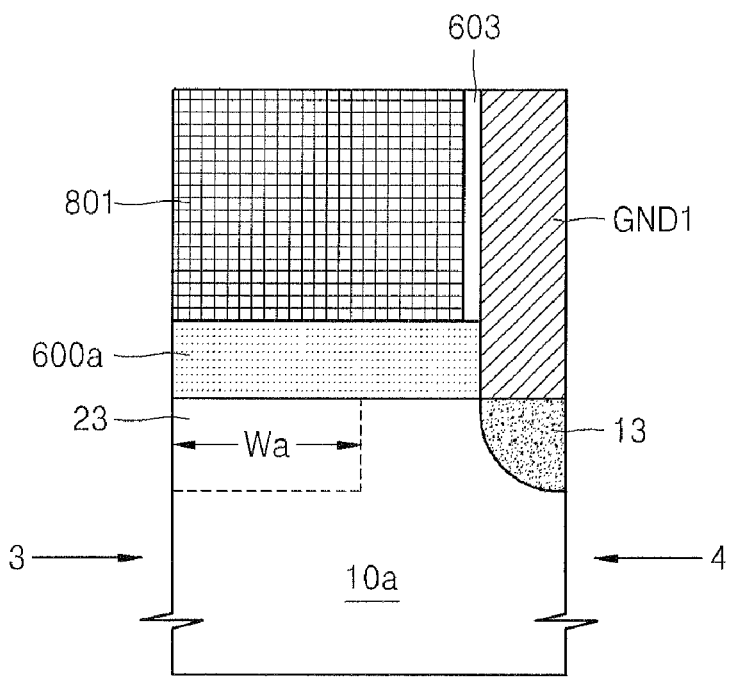
FIG. 7 is a cross-sectional view taken along line A-A' of FIG. 6.
Figure 8:
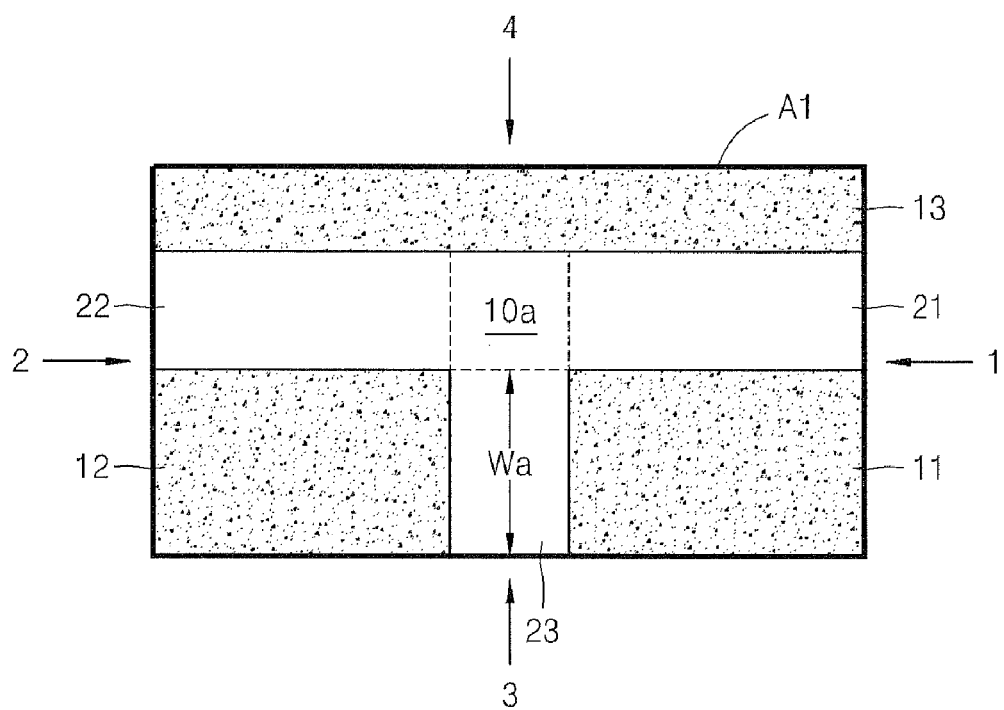
FIG. 8 is a plan view taken along line B-B' of FIG. 6.

FIGS. 5 and 6 respectively illustrate a top plan view and a perspective view of a semiconductor device including a sub word line driver according to an exemplary embodiment of the inventive concept. The semiconductor device according to the present exemplary embodiment is based upon the layout of the semiconductor device of FIG. 4. In addition, FIG. 7 is a cross-sectional view taken along line A-A' of FIG. 6, and FIG. 8 is a plan view taken along line B-B' of FIG. 6.

Referring to FIGS. 5 to 8, a semiconductor device may include a first semiconductor substrate 10a, a first channel region 21, a second channel region 22, a third channel region 23, a first access region 11, a second access region 12, a third access region 13, a first sub word line SW1, a second sub word line SW2, a first ground GND1, and a first gate 801.

The first semiconductor substrate 10a has a rectangular parallelepiped shape with first side surface 1, second side surface 2, third side surface 3 and fourth side surface 4. In the first semiconductor substrate 10a of FIG. 6, the first side surface 1 is a right side surface, the second side surface 2 is a left side surface, the third side surface 3 is a front side surface, and the fourth side surface 4 is a rear side surface. The first semiconductor substrate 10a may be a silicon substrate, a silicon-germanium (Si—Ge) substrate, or a silicon-on-insulation (SOI) substrate.

The first channel region 21 is a channel region of the first N-type transistor 101 and may be formed by injecting a P-type impurity into the first semiconductor substrate 10a from the first side surface 1. The second channel region 22 is a channel region of the second N-type transistor 102 and may be formed by injecting a P-type impurity into the first semiconductor substrate 10a from the second side surface 2 that is opposite to the first side surface 1. The third channel region 23 is a channel region of the first switching transistor 301 and may be formed by injecting a P-type impurity into the first semiconductor substrate 10a from the third side surface 3 that is perpendicular to the first side surface 1.

The first access region 11 may be a drain region of the first N-type transistor 101, or a source or drain region of the first switching transistor 301. The first access region 11 may be formed by injecting an N-type impurity into the first semiconductor substrate 10a via a vertex of the first semiconductor substrate 10a that is disposed between the first channel region 21 and the third channel region 23.

The second access region 12 may be a drain region of the second N-type transistor 102, or a source or drain region of the first switching transistor 301. The second access region 12 may be formed by injecting an N-type impurity into the first semiconductor substrate 10a via a vertex of the first semiconductor substrate 10a that is disposed between the second channel region 22 and the third channel region 23.

The third access region 13 may be a source region of the first N-type transistor 101, or a source region of the second N-type transistor 102. The third channel region 13 may be formed by injecting an N-type impurity into the first semiconductor substrate 10a from the fourth side surface 4 that is opposite to the third side surface 3.

The first sub word line SW1 may be disposed on the first access region 11, and the second sub word line SW2 may be disposed on the second access region 12. The first ground GND1 may be disposed on the third access region 13.

The first gate 801 may be a gate of the first and second N-type transistors 101, 102 and the first switching transistor 301. The first gate 801 may be formed of a conductive material with a T shape and disposed between the first sub word line SW 1, the second sub word line SW2, and the first ground GND1. A first insulator 600a with a T shape may be disposed between the first gate 801 and the first semiconductor substrate 10a. Even though the first gate 801 and the first insulator 600a have the T shape, the inventive concept is not limited thereto. For example, the first gate 801 and the first insulator 600a may also have a Y shape.

In order to electrically insulate the first gate 801 from the first sub word line SW1, a first spacer 601 with an L shape may be formed between the first gate 801 and the first sub word line SW1. In order to electrically insulate the first gate 801 from the second sub word line SW2, a second spacer 602 with an L shape may be formed between the first gate 801 and the second sub word line SW2. In order to electrically insulate the first gate 801 from the first ground GND1, a third spacer 603 with a rectangular parallelepiped shape may be formed between the first gate 801 and the first ground GND1.

The first N-type transistor 101 may be formed by the first gate 801, the first channel region 21, the first access region 11, and the third access region 13. The second N-type transistor 102 may be formed by the first gate 801, the second channel region 22, the second access region 12, and the third access region 13. The first switching transistor 301 may be formed by the first gate 801, the third channel region 23, the first access region 11, and the second access region 12.

The switching current of the first switching transistor 301 may be controlled by varying the doping concentration of the impurity of the third channel region 23. The switching current of the first switching transistor 301 may also be controlled by varying the width Wa of the third channel region 23. A first device isolation region (not shown) may be formed in the first semiconductor substrate 10a from the third side surface 3 for changing the width Wa of the third channel region 23. This will be described with reference to FIGS. 9 to 11.

Referring to FIG. 8, the rectangular active region A1 may be defined by a device isolation region (not shown) external to active region A1. The first access region 11 and the second access region 12 may be formed at both corners of the third side surface 3 of the active region A1. The third access region 13 may be formed to be spaced apart from the first and second access regions 11, 12 and formed between both corners of the fourth side surface 4. Even though portions the first to third channel regions 21, 22, 23 are defined by dotted lines in FIG. 8, this is for descriptive convenience, and various channel regions with various shapes may also be formed. For example, the doping concentrations of the first to third channel regions 21, 22, 23 may be the same or different. In addition, a first integrated channel region (not shown) with a T shape may be formed to include the first to third channel regions 21, 22, 23. In this regard, the first integrated channel region may be defined as a T-shaped region between the first to third access regions 11, 12, 13.

Figure 9:
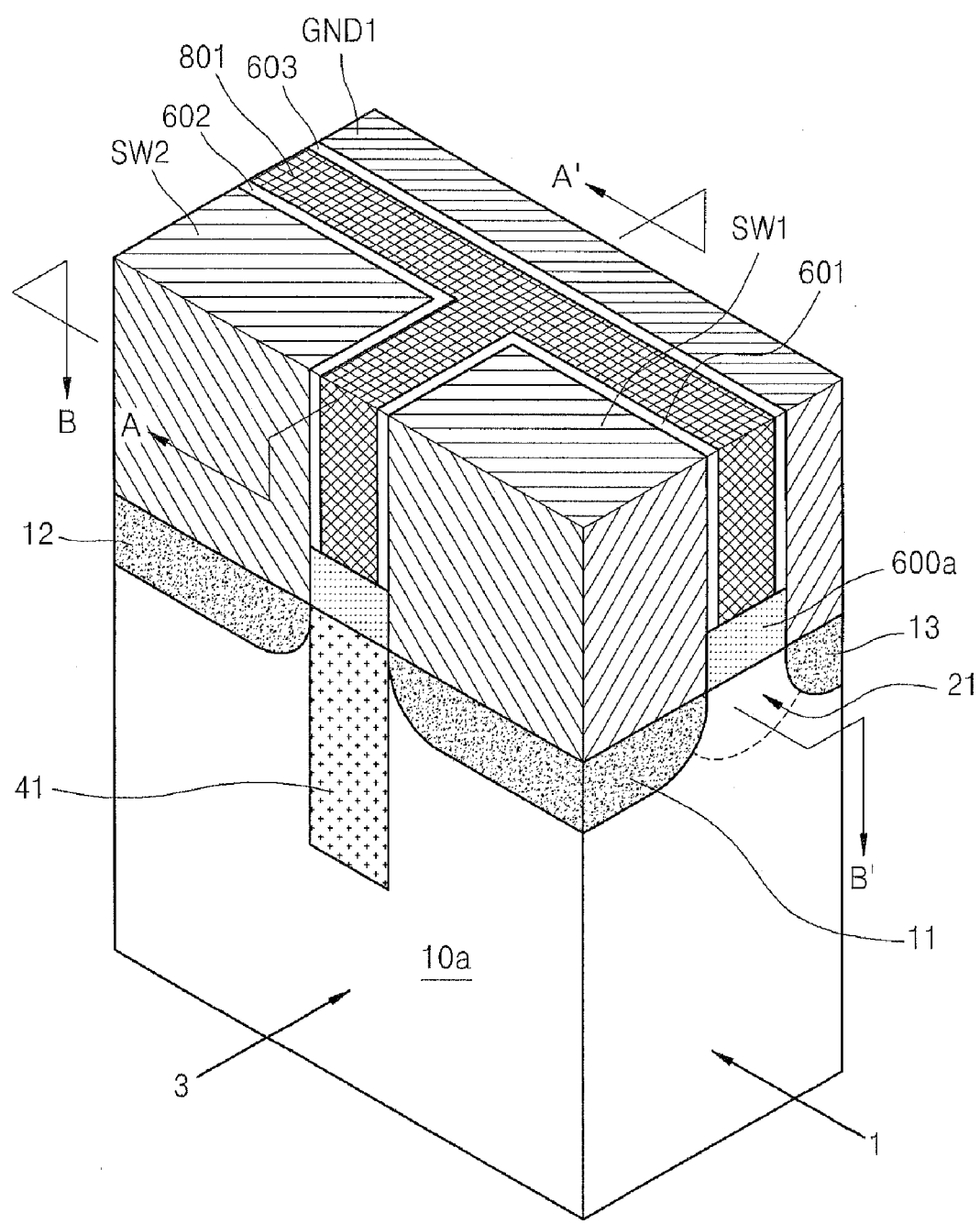
FIG. 9 is a perspective view of a semiconductor device including a sub word line driver according to an exemplary embodiment of the inventive concept.
Figure 10:
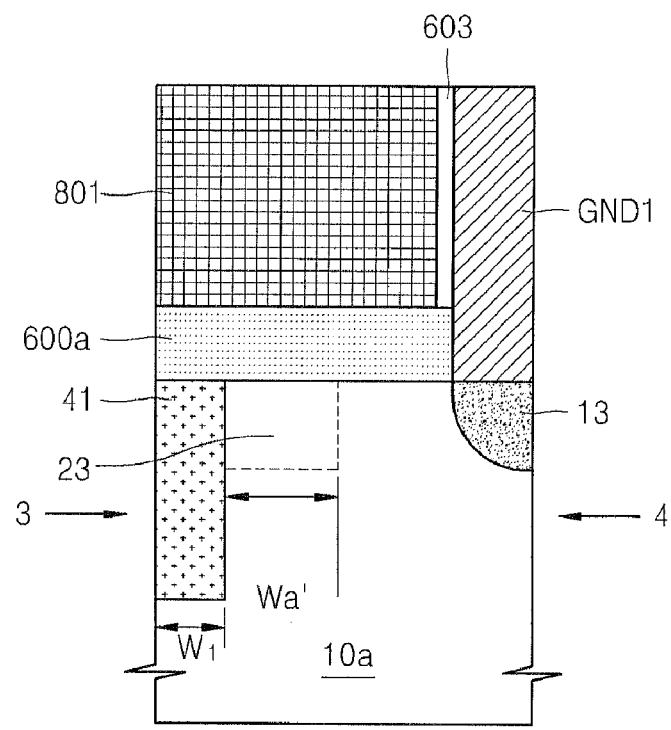
FIG. 10 is a cross-sectional view taken along line A-A' of FIG. 9.
Figure 11:
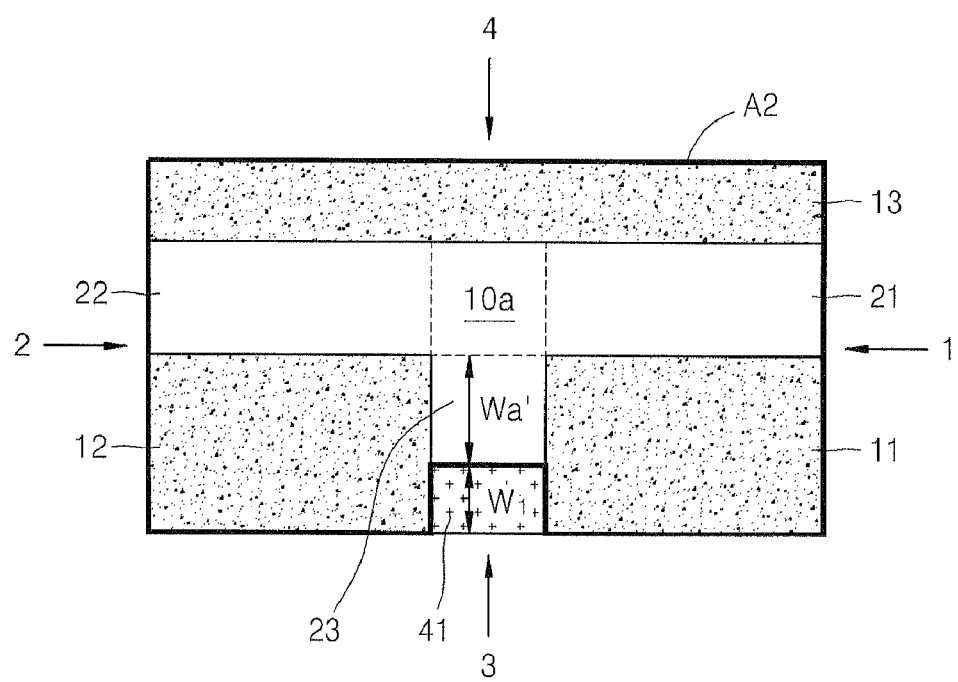
FIG. 11 is a plan view taken along line B-B' of FIG. 9.

FIG. 9 is a perspective view of a semiconductor device including a sub word line driver which is shown in FIG. 6 and further including a first device isolation region 41. FIG. 10 is a cross-sectional view taken along line A-A' of FIG. 9, and FIG. 11 is a plan view taken along line B-B' of FIG. 9. The common elements of the semiconductor device that have been described above will not be described again here.

Referring to FIGS. 9 to 11, the first device isolation region 41 may be an insulating layer that is formed from the third side surface 3 into the first semiconductor substrate 10a. The first device isolation region 41 may be formed by local oxidation of silicon (LOCOS) or shallow trench isolation (STI). By the first device isolation region 41, the first N-type transistor 101, second N-type transistors 102 and the first switching transistor 301 may be formed in an active region A2 with a U shape.

The first device isolation region 41 may extend from the third side surface 3 toward the fourth side surface 4 by a predetermined thickness. In particular, the first device isolation region 41 may have a thickness W1 from the third side surface 3 into the first semiconductor substrate 10a. The first device isolation region 41 may change the width Wa' of the third channel region 23, and thus a switching current of the first switching transistor 301 may be controlled by the first device isolation region 41.

Figure 12:
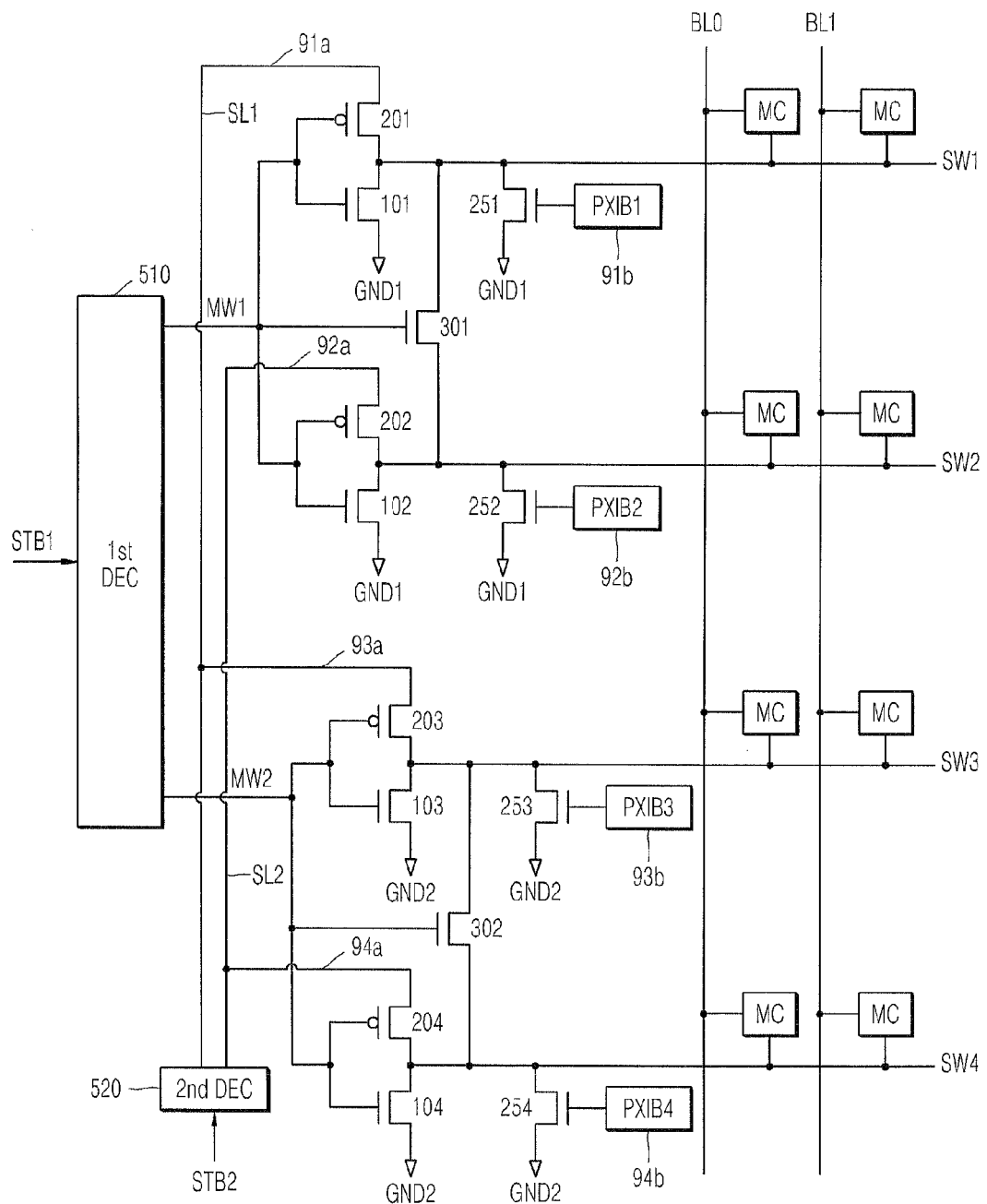
FIG. 12 is a circuit diagram schematically illustrating a semiconductor device including a sub word line driver according to an exemplary embodiment of the inventive concept.
Figure 13:
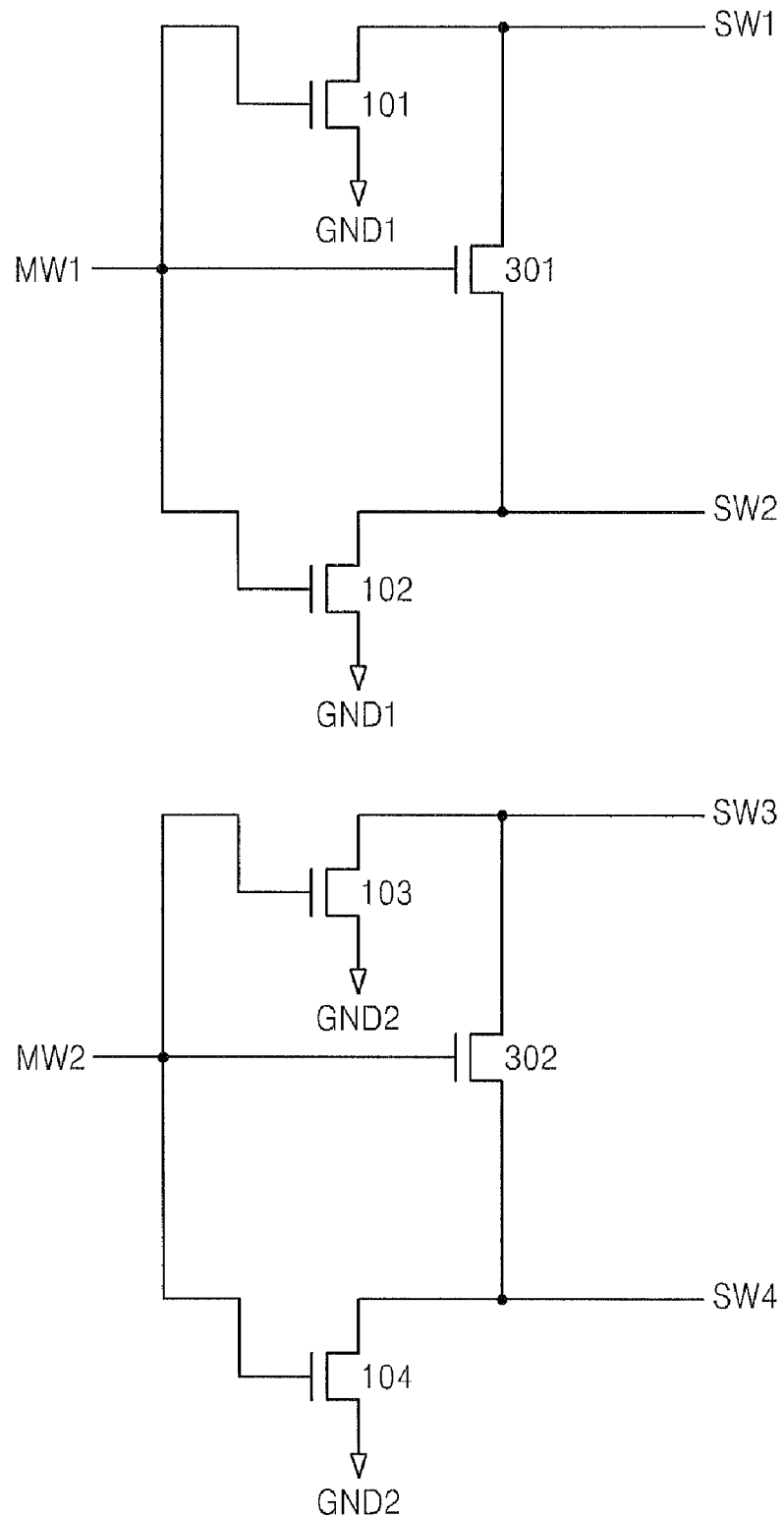
FIG. 13 is a circuit diagram illustrating first to fourth N-type transistors and first and second switching transistors of the semiconductor device of FIG. 12.
Figure 14:
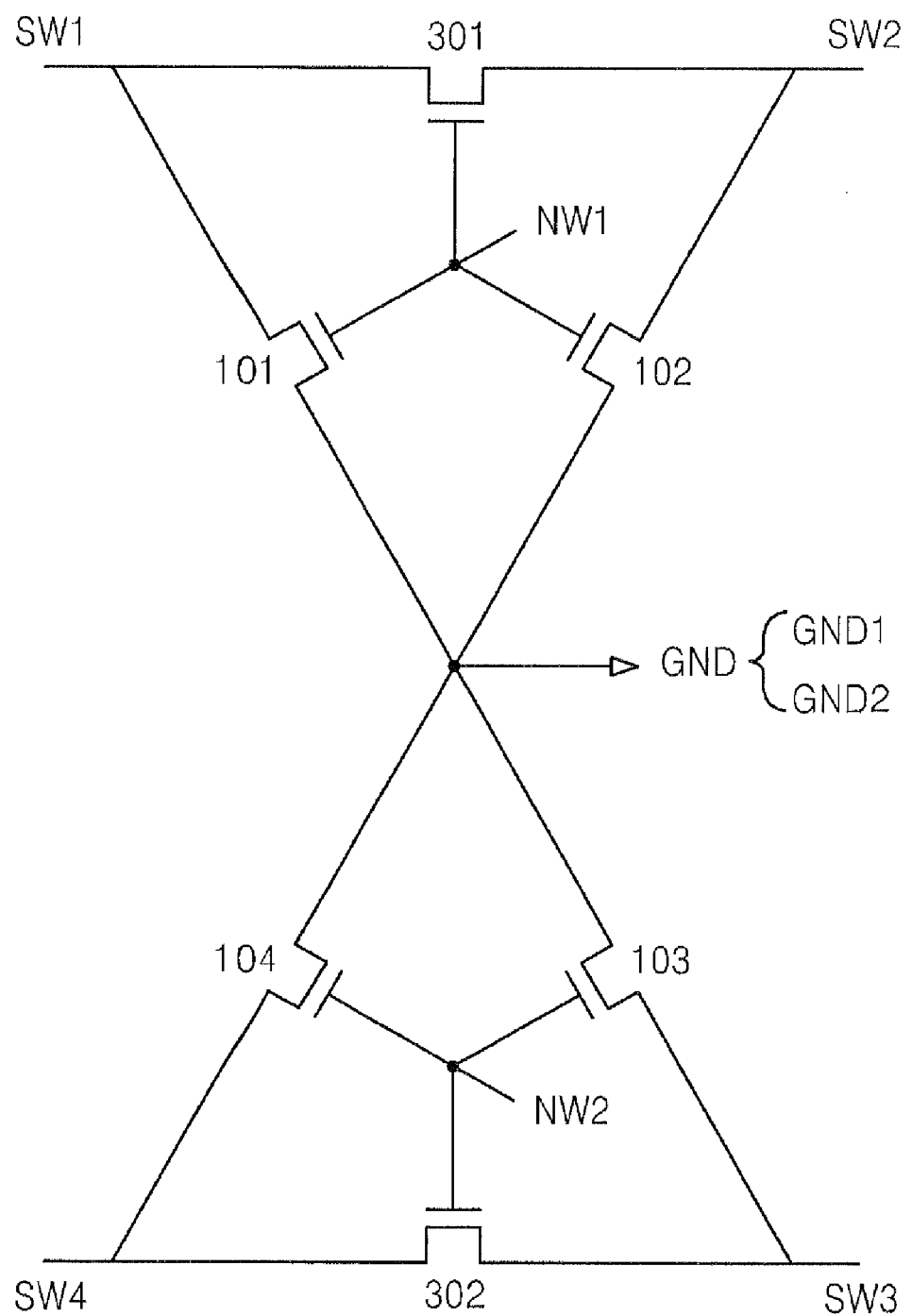
FIG. 14 is a circuit diagram, substantially the same as the circuit diagram of FIG. 13, illustrating an exemplary layout of the first to fourth N-type transistors and the first and second switching transistors of FIG. 13.

FIG. 12 is a circuit diagram schematically illustrating a semiconductor device including a sub word line driver according to an exemplary embodiment of the inventive concept. FIG. 13 is a circuit diagram illustrating first N-type transistor 101, second N-type transistor 102, third N-type transistor 103, fourth N-type transistor 104, first switching transistor 301 and second switching transistor 302 of the semiconductor device of FIG. 12. FIG. 14 is a circuit diagram, substantially the same as FIG. 13, illustrating an exemplary layout of first to fourth N-type transistors 101, 102, 103, 104 and first and second switching transistors 301, 302 of FIG. 13. The semiconductor device according to the present exemplary embodiment may be a modified version of the exemplary embodiments of the semiconductor devices of FIGS. 1 to 3. The common elements of the semiconductor device that have been previously described above will not be described again here.

Referring to FIGS. 12 to 14, a semiconductor device may further include third and fourth P-type transistors 203, 204, third and fourth N-type transistors 103, 104, third and fourth sub word lines SW3, SW4, a second switching transistor 302, and a second main word line MW2. The semiconductor device may also include first and second P-type transistors 201, 202, first and second N-type transistors 101, 102, first and second sub word lines SW 1, SW2, a first switching transistor 301, and a first main word line MW1 as described above.

One end of the third P-type transistor 203 may be connected to a third selection signal receiving unit 93a, and the other end of the third P-type transistor 203 may be connected to the third sub word line SW3. A gate of the third P-type transistor 203 may be connected to the second main word line MW2. One end of the fourth P-type transistor 204 may be connected to a fourth selection signal receiving unit 94a, and the other end of the fourth P-type transistor 204 may be connected to the fourth sub word line SW4. A gate of the fourth P-type transistor 204 may be connected to the second main word line MW2.

One end of the third N-type transistor 103 may be connected to a second ground GND2, and the other end of the third N-type transistor 103 may be connected to the third sub word line SW3. A gate of the third P-type transistor 103 may be connected to the second main word line MW2. One end of the fourth N-type transistor 104 may be connected to a second ground GND2, and the other end of the fourth N-type transistor 104 may be connected to the fourth sub word line SW4. A gate of the fourth P-type transistor 104 may be connected to the second main word line MW2.

The first to fourth sub word lines SW1, SW2, SW3, SW4 may transmit an operation signal to a memory cell MC. The memory cell MC may be connected to bit lines BL0, BL1 to store or output data according to the operation signal The third sub word line SW3 may have one end connected to the other ends of the third P-type transistor 203 and the third N-type transistor 103. The fourth sub word line SW4 may be have one end connected to the other ends of the fourth P-type transistor 204 and the fourth N-type transistor 104.

The respective ends of the second switching transistor 302 may be connected to the third sub word line SW3 and the fourth sub word line SW4. A gate of the second switching transistor 302 may be connected to the second main word line MW2.

The second main word line MW2 may receive an operation signal and optionally send the operation signal to the third sub word line SW3 and the fourth sub word line SW4. The second main word line MW2 may be connected to gates of the third and fourth N-type transistors 103, 104, the third and fourth P-type transistors 203, 204, and the second switching transistor 302.

The semiconductor device may further include a third N-type inhibitory transistor 253 that is disposed between the third sub word line SW3 and the second ground GND2 and a fourth N-type inhibitory transistor 254 that is disposed between the fourth sub word line SW4 and a second ground GND2. A gate of the third N-type inhibitory transistor 253 may be connected to a third selection bar signal receiving unit 93b and receive a signal that is complementary to the third selection signal received from the third selection signal receiving unit 93a. A gate of the fourth N-type inhibitory transistor 254 may be connected to a fourth selection bar signal receiving unit 94b and receive a signal that is complementary to the fourth selection signal received from the fourth selection signal receiving unit 94a.

The semiconductor device may further include a first decoder 510 that receives a first strobe signal STB1 and alternately sends an operation signal to either the first main word line MW1 or the second main word line MW2. The semiconductor device may further include a second decoder 520 that receives a second strobe signal STB2 and alternately sends a selection signal to the first to fourth sub word lines SW1, SW2, SW3, SW4.

For example, the first selection signal receiving unit 91a and the third selection signal receiving unit 93a may be connected to the first selection line SL1. The second selection signal receiving unit 92a and the fourth selection signal receiving unit 94a may be connected to the second selection line SL2. In this regard, the second decoder 520 may receive the second strobe signal STB2, and alternately send a selection signal to either the first selection line SL1 or the second selection line SL2.

Figure 15:
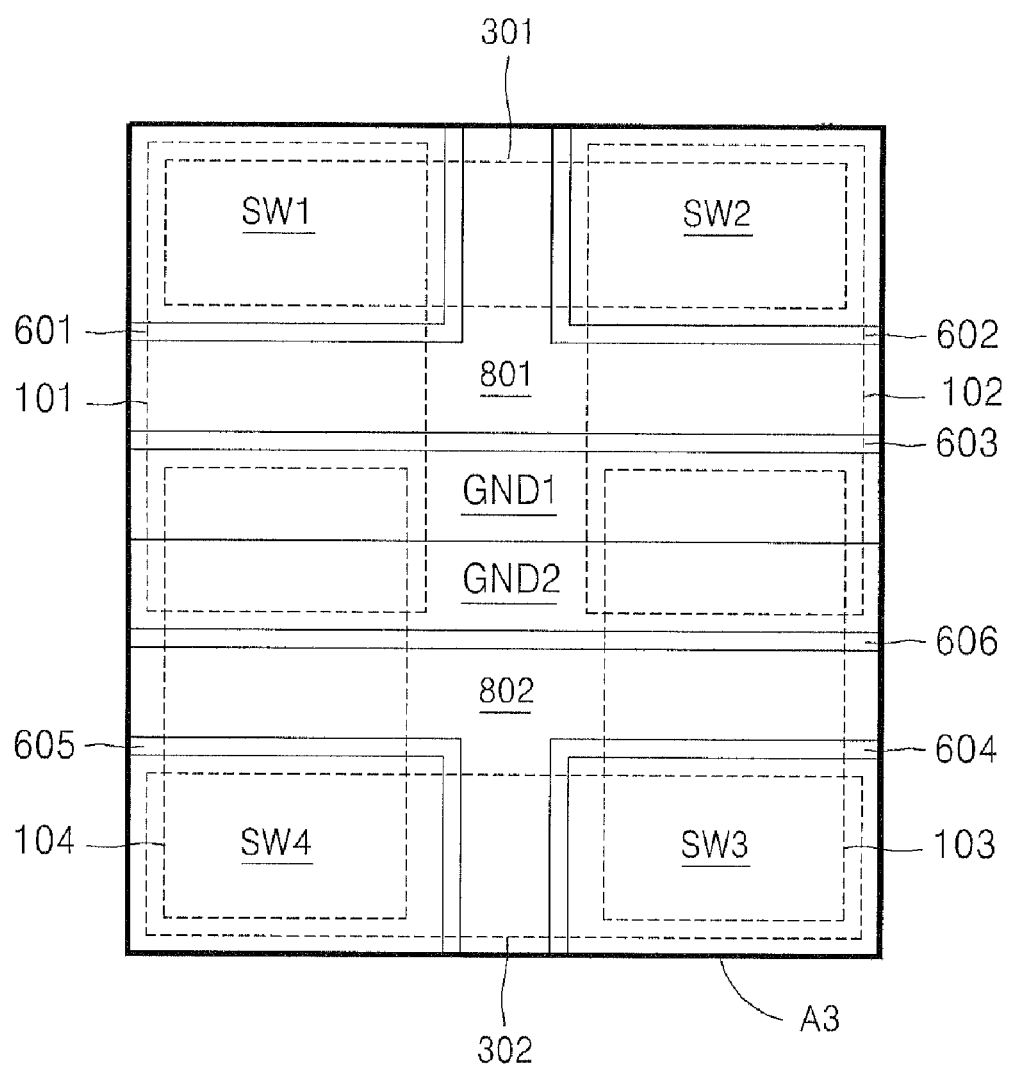
FIG. 15 illustrates a schematic layout of a semiconductor device including a sub word line driver according to an exemplary embodiment of the inventive concept.

FIG. 15 schematically illustrates a layout of a semiconductor device including a sub word line driver according to an exemplary embodiment of the inventive concept. The layout of the semiconductor device according to the present exemplary embodiment shows a circuit diagram illustrating first to fourth N-type transistors 101, 102, 103, 104 and first and second switching transistors 301, 302 of FIG. 14.

Referring to FIG. 15, the first to fourth N-type transistors 101, 102, 103, 104, and the first and second switching transistors 301, 302 may be formed in a rectangular active region A3. In particular, the first N-type transistor 101 including a first gate 801 may be disposed between the first sub word line SW1 and the first ground GND1. The second N-type transistor 102 including a first gate 801 may be disposed between the second sub word line SW2 and the first ground GND1. The first switching transistor 301 including the first gate 801 may be disposed between the first sub word line SW1 and the second sub word line SW2. The first gate 801 may be electrically connected to a first word line (not shown).

The third N-type transistor 103 including a second gate 802 may be disposed between the third sub word line SW3 and the second ground GND2. The fourth N-type transistor 104 including a second gate 802 may be disposed between the fourth sub word line SW4 and the second ground GND2. The second switching transistor 302 including the second gate 802 may be disposed between the third sub word line SW3 and the fourth sub word line SW4. The second gate 802 may be electrically connected to a second word line (not shown).

Figure 16:
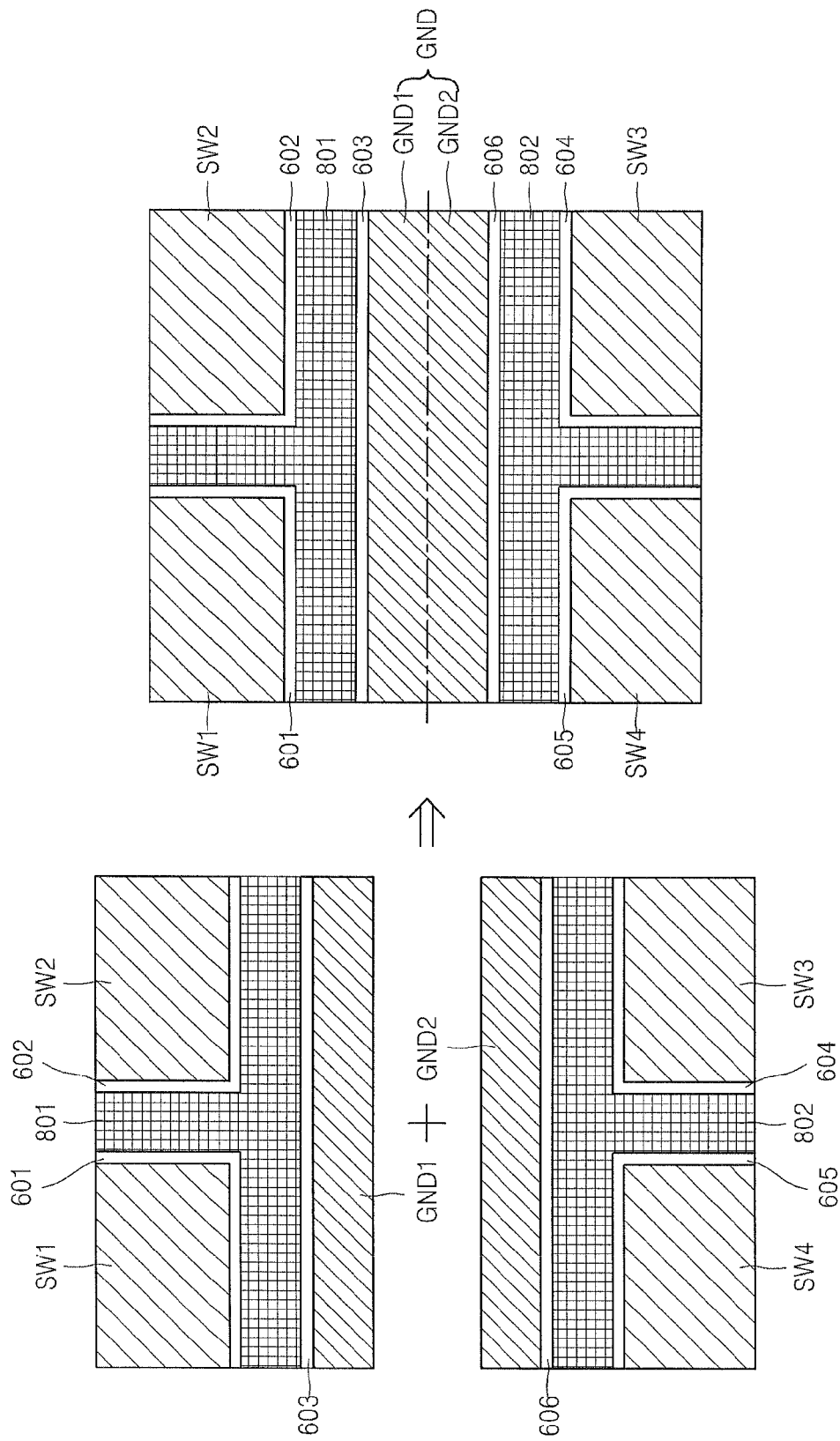
FIGS. 16 and 17 respectively illustrate a top plan view and a perspective view of a semiconductor device including a sub word line driver according to an exemplary embodiment of the inventive concept.
Figure 17:
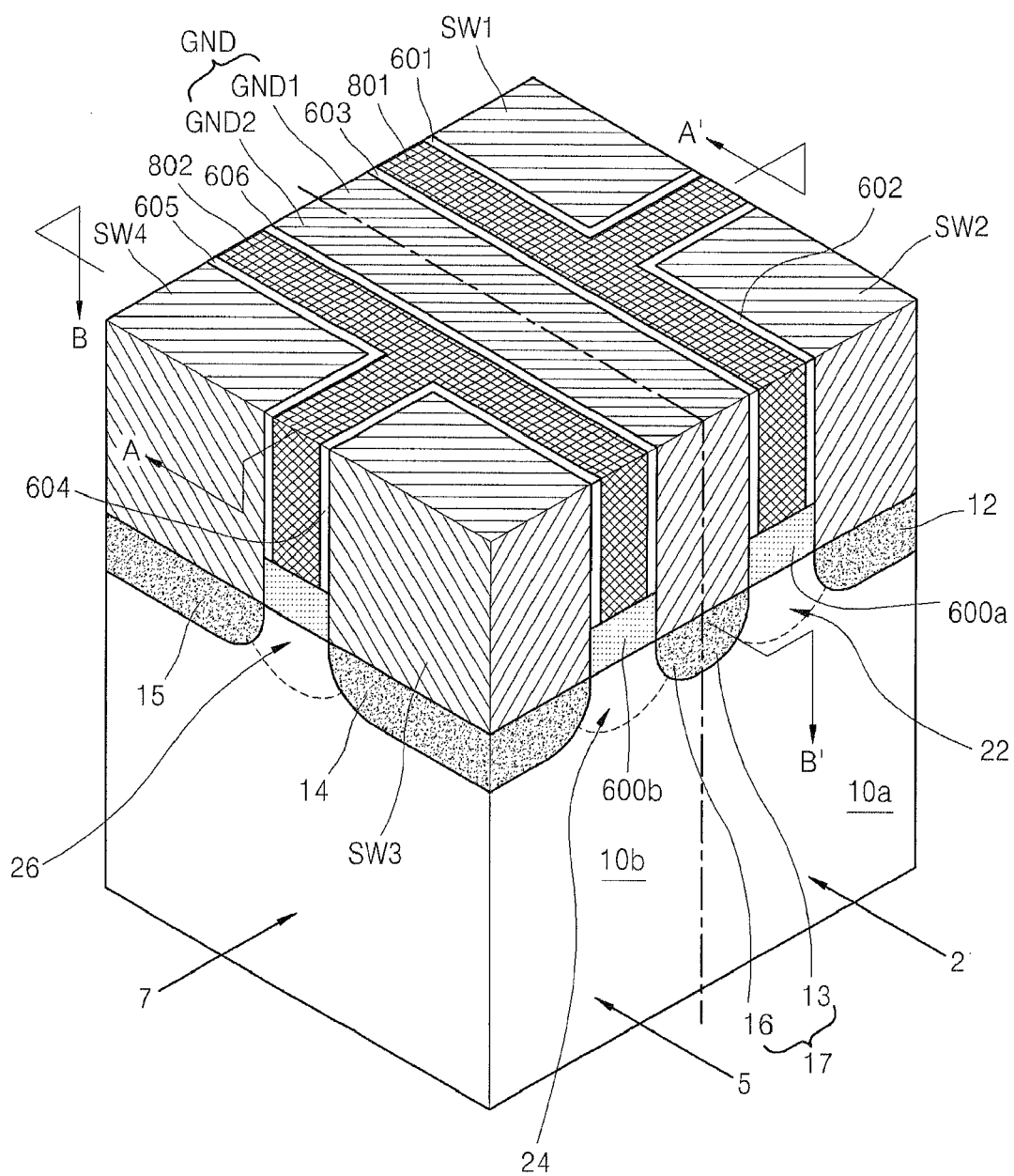
Figure 18:
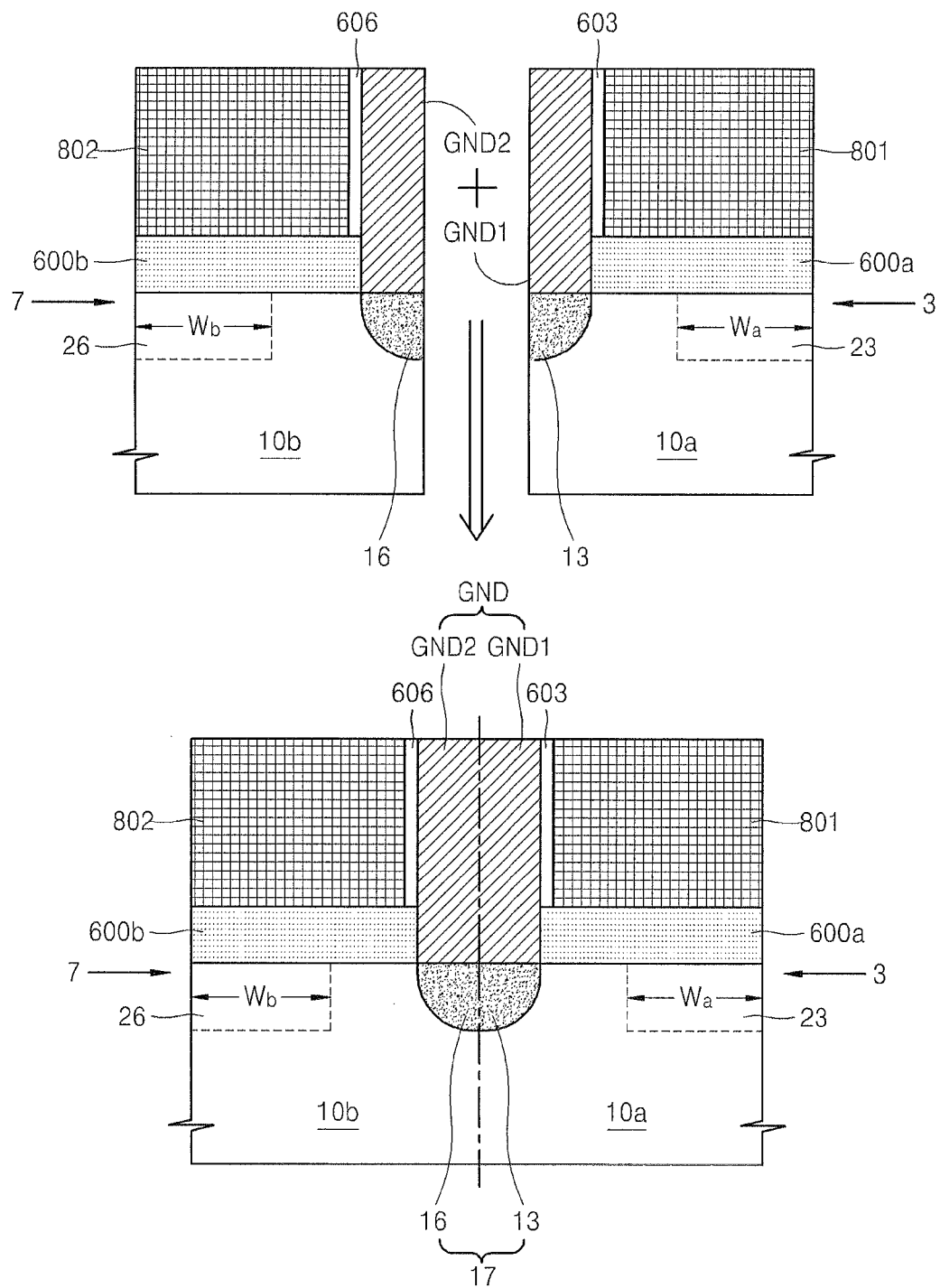
FIG. 18 is a cross-sectional view taken along line A-A' of FIG. 17.
Figure 19:
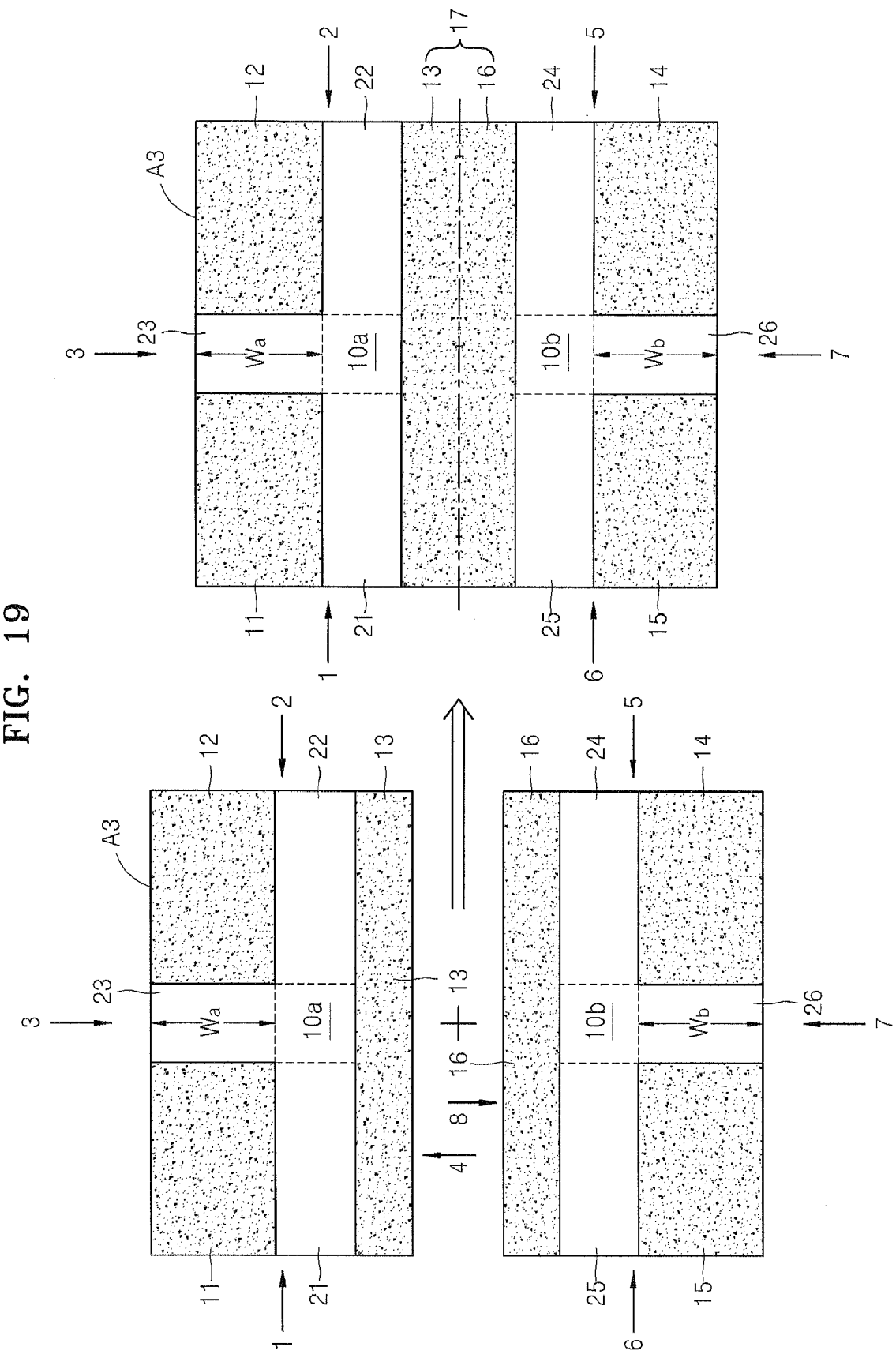
FIG. 19 is a plan view taken along line B-B' of FIG. 17.

FIGS. 16 and 17 respectively illustrate a top plan view and a perspective view of a semiconductor device including a sub word line driver according to an exemplary embodiment of the inventive concept. The semiconductor device according to the present exemplary embodiment is based upon the layout of the semiconductor device of FIG. 15. FIG. 18 is a cross-sectional view taken along line A-A' of FIG. 17, and FIG. 19 is a plan view taken along line B-B' of FIG. 17. The semiconductor device according to the present exemplary embodiment may be a modified version of the exemplary embodiments of the semiconductor devices of FIGS. 5 to 8. The elements of the semiconductor device that have been described above will not be described again here.

Referring to FIGS. 16 to 19, a semiconductor device may further include a second semiconductor substrate 10b, a fourth channel region 24, a fifth channel region 25, a sixth channel region 26, a fourth access region 14, a fifth access region 15, a sixth access region 16, a third sub word line SW3, a fourth sub word line SW4, a second ground GND1, and a second gate 802. The semiconductor device may also include previously described first semiconductor substrate 10a, first to third channel regions 21, 22, 23, first to third access regions 11, 12, 13, first and second sub word lines SW1, SW2, a first ground GND1, and a first gate 801. In particular, the semiconductor device may be formed by an active merge by which the fourth side surface 4 of the first semiconductor substrate 10a directly contacts with an eighth side surface 8 of the second semiconductor substrate 10b.

The second semiconductor substrate 10b has a rectangular parallelepiped shape with fifth side surface 5, sixth side surface 6, seventh side surface 7 and eighth side surface 8. The second semiconductor substrate 10b may be a silicon substrate, a silicon-germanium (Si—Ge) substrate, or a silicon-on-insulation (SOI) substrate.

The fourth channel region 24 is a channel region of the third N-type transistor 103 and may be formed by injecting a P-type impurity into the second semiconductor substrate 10b from the fifth side surface 5. The fifth channel region 25 is a channel region of the fourth N-type transistor 104 and may be formed by injecting a P-type impurity into the second semiconductor substrate 10b from the sixth side surface 6 that is opposite to the fifth side surface 5. The sixth channel region 26 is a channel region of the second switching transistor 302 and may be formed by injecting a P-type impurity into the second semiconductor substrate 10b from the seventh side surface 7 that is perpendicular to the fifth side surface 5.

The fourth access region 14 may be a drain region of the third N-type transistor 103, or a source or drain region of the second switching transistor 302. The fourth access region 14 may be formed by injecting an N-type impurity into a vertex of the second semiconductor substrate 10b that is disposed between the fourth channel region 24 and the sixth channel region 26.

The fifth access region 15 may be a drain region of the fourth N-type transistor 104, or a source or drain region of the second switching transistor 302. The fifth access region 15 may be formed by injecting an N-type impurity into a vertex of the second semiconductor substrate 10b that is disposed between the fifth channel region 25 and the sixth channel region 26.

The sixth access region 16 may be a source region of the third N-type transistor 103, or a source region of the fourth N-type transistor 104. The sixth access region 16 may be formed by injecting an N-type impurity into the second semiconductor substrate 10b from the eighth side surface 8 that is opposite to the seventh side surface 7.

The third sub word line SW3 may be disposed on the fourth access region 14, and the fourth sub word line SW4 may be disposed on the fifth access region 15. The second ground GND2 may be disposed on the sixth access region 16.

The second gate 802 may be a gate of the third and fourth N-type transistors 103, 104 and the second switching transistor 302. The second gate 802 may be formed of a conductive material with a T shape and disposed between the third sub word line SW3, the fourth sub word line SW4, and the second ground GND2. A second insulator 600b with a T shape may be disposed between the second gate 802 and the second semiconductor substrate 10b. As with the first gate 801 and the first insulator 600a, the shapes of the second gate 802 and the second insulator 600b are not limited to the T shape. For example, the second gate 802 and the second insulator 600b may also have a Y shape.

In order to electrically insulate the second gate 802 from the third sub word line SW3, a fourth spacer 604 with a L shape may be formed between the second gate 802 and the third sub word line SW3. In order to electrically insulate the second gate 802 from the fourth sub word line SW4, a fifth spacer 605 with a L shape may be formed between the second gate 802 and the fourth sub word line SW4. In order to electrically insulate the second gate 802 from the second ground GND2, a sixth spacer 606 with a rectangular parallelepiped shape may be formed between the second gate 802 and the second ground GND2.

The fourth side surface 4 of the first semiconductor substrate 10a may directly contact with the eighth side surface 8 of the second semiconductor substrate 10b as described above. In this regard, the third access region 13 may directly contact with the sixth access region 16 so as to form an integrated access region 17. The first ground GND1 may also directly contact with the second ground GND2, and thus an integrated ground GND may be formed on the integrated access region 17.

The first gate 801 and the second gate 802 may be symmetrical with respect to the integrated ground GND. In the same manner, the first to third channel regions 21, 22, and 23 and the fourth to sixth channel regions 24, 25, 26 may be symmetrical with respect to the integrated access region 17, and the first and second access regions 11, 12 and the fourth and fifth access regions 14, 15 may be symmetrical with respect to the integrated access region 17.

The third N-type transistor 103 may be formed by the second gate 802, the fourth channel region 24, the fourth access region 14, and the sixth access region 16. The fourth N-type transistor 104 may be formed by the second gate 802, the fifth channel region 25, the fifth access region 15, and the sixth access region 16. The second switching transistor 302 may be formed by the second gate 802, the sixth channel region 26, the fourth access region 14, and the fifth access region 15. In the same manner, the first and second N-type transistors 101, 102 and the first switching transistor 301 may be formed by the first gate 801, the first to third channel regions 21, 22, 23, and the first to third access region 11, 12, 13.

A switching current of the first switching transistor 301 may be controlled by varying the doping concentration of the impurity of the third channel region 23. A switching current of the first switching transistor 301 may also be controlled by varying the width Wa of the third channel region 23. In the same manner, a switching current of the second switching transistor 302 may be controlled by varying the doping concentration of the impurity of the sixth channel region 26 or by varying the width Wb of the sixth channel region 26.

A first device isolation region having a thickness of W1 may be formed in the first semiconductor substrate 10a from the third side surface 3 for changing the width Wa of the third channel region 23. In addition, a second device isolation region having a thickness of W2 may be formed in the second semiconductor substrate 10b from the seventh side surface 7 for changing the width Wb of the sixth channel region 26. This will be described below with reference to FIGS. 20 to 22.

Referring to FIG. 19, the rectangular active region A3 may be defined by a device isolation region (not shown) external to active region A3. The first access region 11 and the second access region 12 may respectively be formed at both corners of the third side surface 3 of the active region A3. The fourth access region 14 and the fifth access region 15 may respectively be formed at both corners of the seventh side surface 7 of the active region A3.

The integrated access region 17 may be formed to be spaced apart from the first to fourth access regions 11, 12, 14, 15 and formed between one combined side surface 1, 6 and the other combined side surface 2, 5 of the active region A3 which are perpendicular to third side surface 3 and the seventh side surface 7.

As described above, even though portions of the first to third channel regions 21, 22, 23 are defined by dotted lines in FIG. 19, this is for descriptive convenience, and various channel regions with various shapes may also be formed. Thus, for example, the doping concentrations of the fourth to sixth channel regions 24, 25, 26 may be the same or different. In addition, a second integrated channel region (not shown) with a T shape may be formed to include the fourth to sixth channel regions 24, 25, 26. In this regard, the second integrated channel region may be defined as a T-shaped region between the fourth to sixth access regions 14, 15, 16 as the first integrated channel region that is defined as the T-shaped region between the first to third access regions 11, 12, 13.

Figure 20:
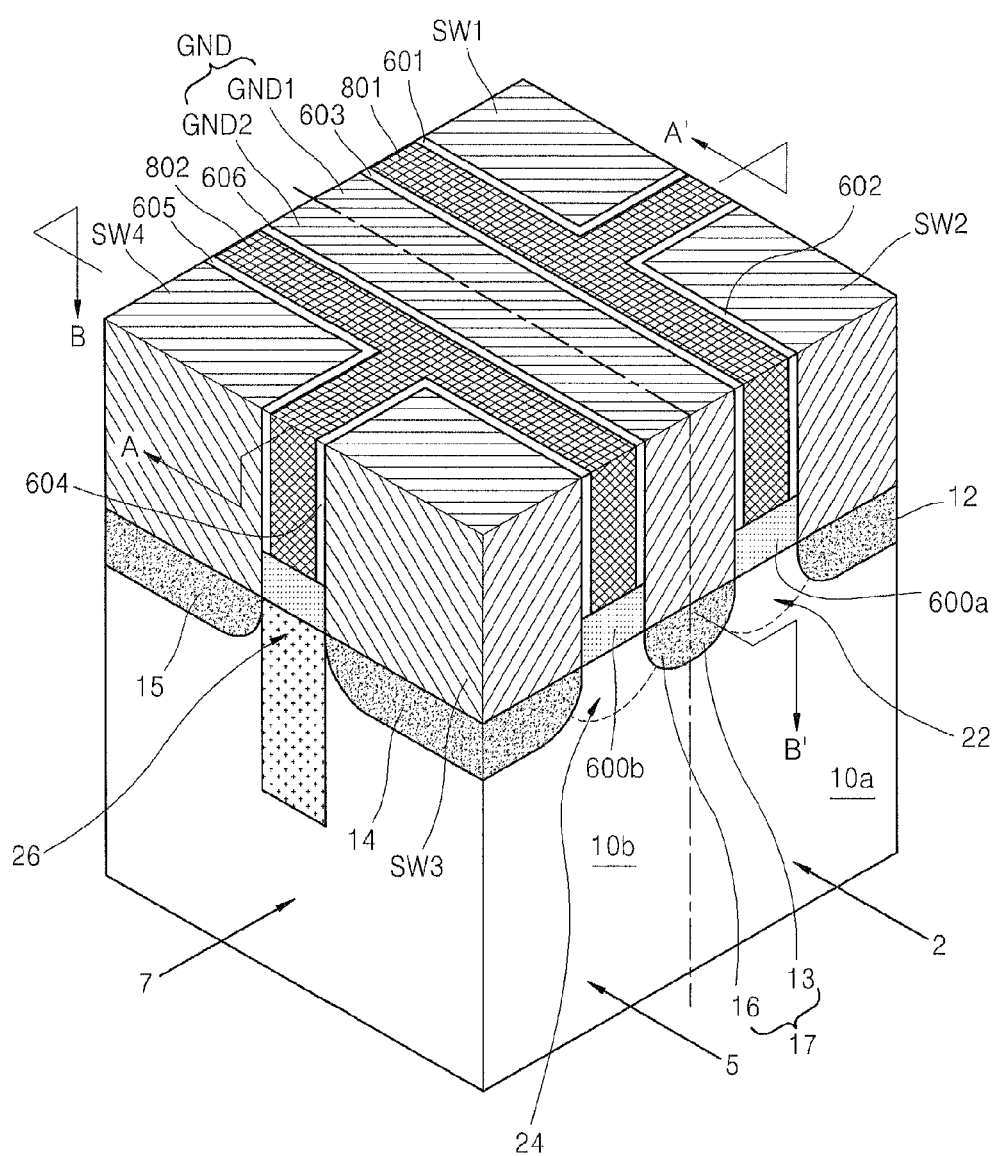
FIG. 20 is a perspective view of a semiconductor device including a sub word line driver according to an exemplary embodiment of the inventive concept.
Figure 21:
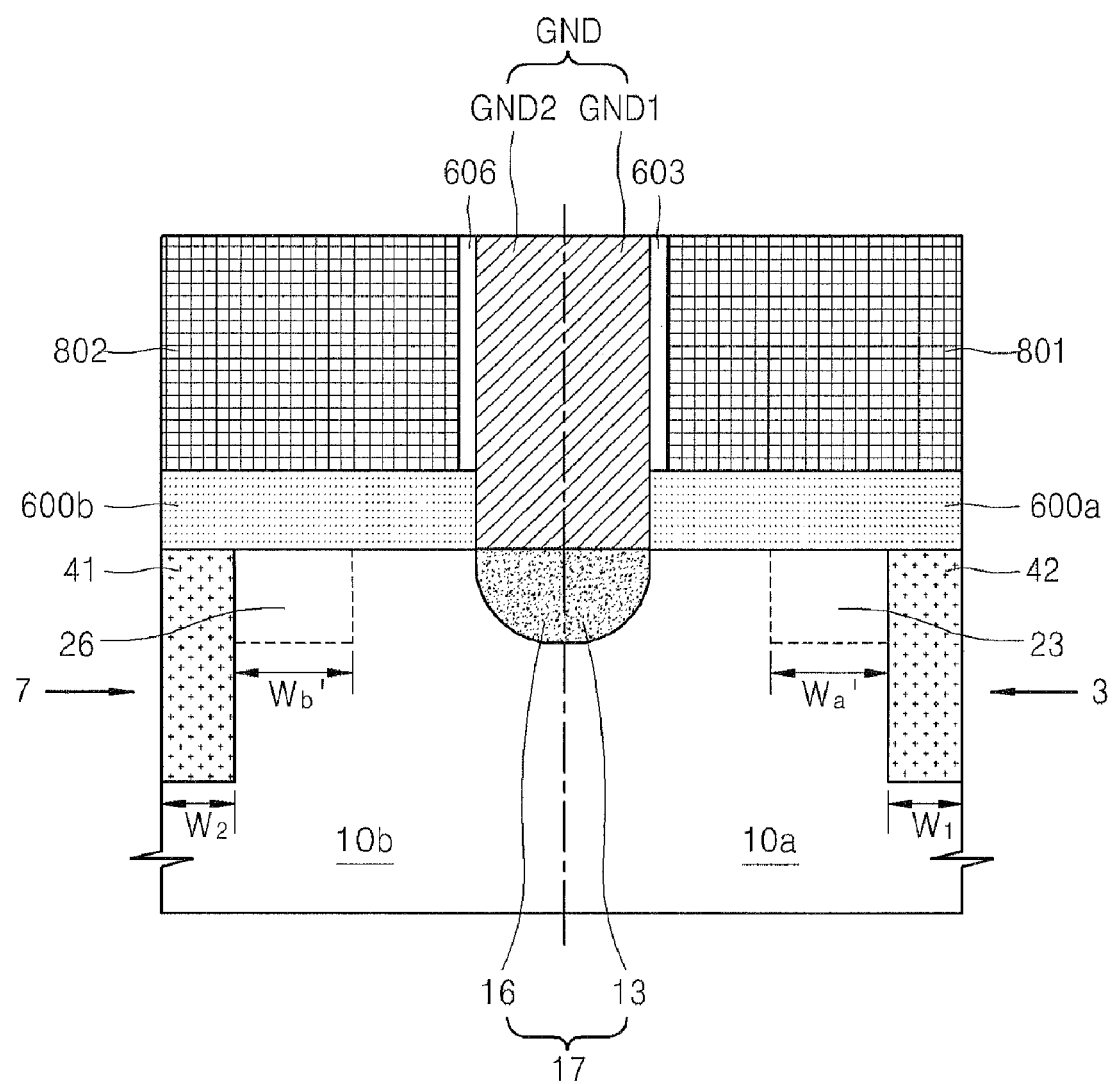
FIG. 21 is a cross-sectional view taken along line A-A' of FIG. 20.
Figure 22:
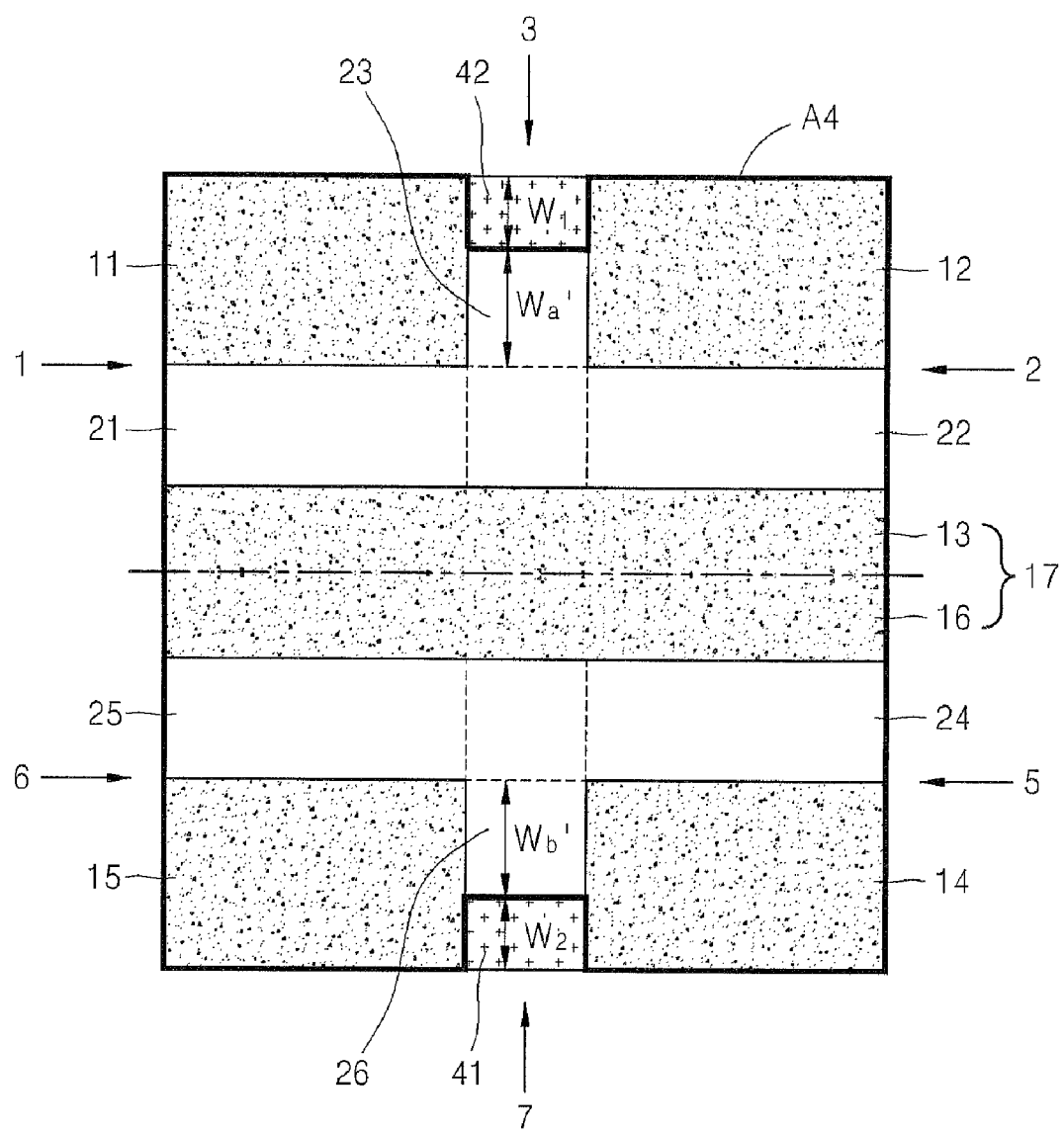
FIG. 22 is a plan view taken along line B-B' of FIG. 20.

FIG. 20 is a perspective view of a semiconductor device including a sub word line driver which is shown in FIG. 17 and further including a device isolation region. FIG. 21 is a cross-sectional view taken along line A-A' of FIG. 20, and FIG. 22 is a plan view taken along line B-B' of FIG. 20. The elements of the semiconductor device that are described above will not be described again here.

Referring to FIGS. 20 to 22, a first device isolation region 41 may be an insulating layer that is formed from the third side surface 3 into the first semiconductor substrate 10a, and a second device isolation region 42 may be an insulating layer that is formed from the seventh side surface 7 into the second semiconductor substrate 10b. The first and second device isolation regions 41, 42 may be formed by local oxidation of silicon (LOCOS) or shallow trench isolation (STI). By the first device isolation region 41, the first and second N-type transistors 101, 102 and the first switching transistor 301 may be formed in an active region A2 of FIG. 11 with a U shape. In the same manner, by the second device isolation region 42, the third and fourth N-type transistors 103, 104 and the second switching transistor 302 may be formed in an active region A2 of FIG. 11 with a U shape. Thus, the first to fourth N-type transistors 101, 102, 103, 104, and the first and second switching transistors 301, 302 may be formed in an H-shaped active region A4 by active merge.

The first device isolation region 41 may extend from the third side surface 3 to the seventh side surface 7 by a predetermined thickness. In particular, the first device isolation region 41 may have a thickness W1 from the third side surface 3 into the first semiconductor substrate 10a. The first device isolation region 41 may change the width Wa' of the third channel region 23, and thus a switching current of the first switching transistor 301 may be controlled by the first device isolation region 41.

The second device isolation region 42 may extend from the seventh side surface 7 to the fourth side surface 4 by a predetermined thickness. In particular, the second device isolation region 42 may have a thickness W2 from the seventh side surface 7 into the first semiconductor substrate 10a. The second device isolation region 42 may change the width Wb' of the sixth channel region 26, and thus a switching current of the second switching transistor 302 may be controlled by the second device isolation region 42.

Figure 23:
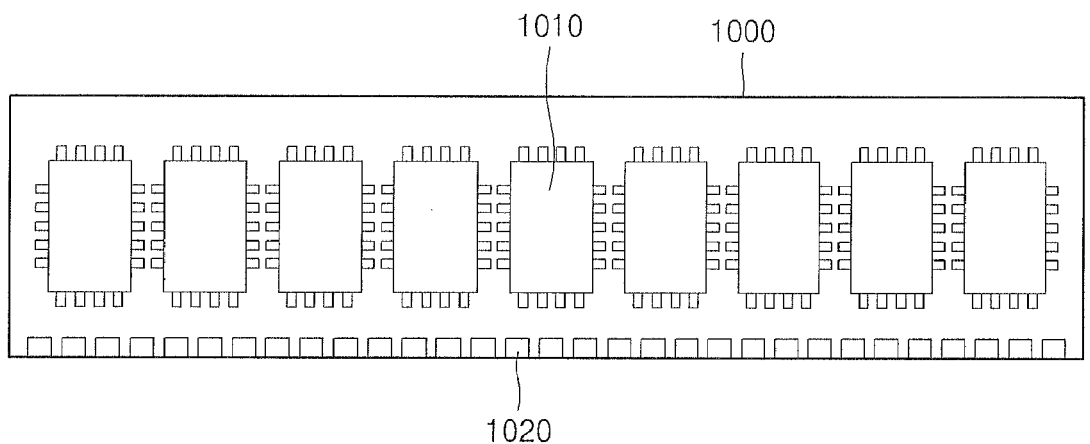
FIG. 23 is a plan view of a memory module including a memory device according to an exemplary embodiment of the inventive concept.

FIG. 23 is a plan view of a memory module 1000 including a memory device having implementations of the exemplary embodiments of the inventive concept.

Referring to FIG. 23, the memory module 1000 may include a plurality of memory chips 1010 and a plurality of external terminals 1020. Each of the memory chips 1010 may respectively include implementations of the exemplary embodiments of the semiconductor memory device shown in FIG. 12. The external terminals 1020 may be connected to the first and second decoders 510, 520 (FIG. 12) and the bit lines BL0, BL1 (FIG. 12) which are disposed within the memory device of each of the memory chips 1010. The external terminals 1020 may be connected to a computing system (not shown), so that first and second strobe signals STB1, STB2 (FIG. 12) and input data signals may be transmitted from the computing system to the memory device and data signals that are stored in the memory device of each memory chip 1010 may be transmitted to the computing system.

Figure 24:
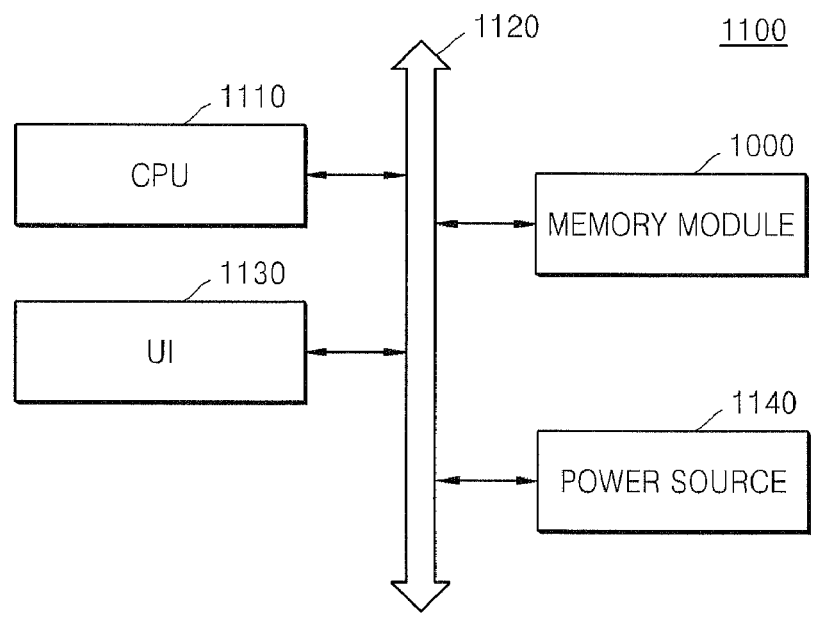
FIG. 24 is a block diagram illustrating a computing system including a memory module according to an exemplary embodiment of the inventive concept.

FIG. 24 is a block diagram illustrating a computing system 1100 including a memory module which can implement the exemplary embodiments of the inventive concept.

Referring to FIG. 24, the computing system 1100 may include a central processor unit (CPU) 1110, a user interface (UI) 1130, a power source 1140, and a memory module 1000.

The memory module 1000 is electrically connected to the CPU 1110, the UI 1130, and the power source 1140 via a system bus 1120. Data are received via the UI 1130 or processed by the CPU 1110 are stored in the memory module 1000. Even though not shown herein, the computing system 1100 according to the present exemplary embodiment may further include an application chipset, a camera image processor, or the like.

Elements illustrated in the drawings, which are provided for clear understanding of the inventive concept, should be regarded as illustrative only. It should be understood that the element may be modified in various forms other than the illustrated ones. The same reference numerals refer to the same constitutional elements throughout the drawings.

While the inventive concept has been particularly shown and described with reference to exemplary embodiments thereof, it will be understood that various changes in form and details may be made therein without departing from the spirit and scope of the following claims.

What is claimed is:

1. A semiconductor device comprising:
   a first sub word line and a second sub word line, each of which transmits an operation signal to a memory cell;
   a main word line that alternately sends the operation signal to either the first sub word line or the second sub word line; and
   a switching transistor electrically connected between the first sub word line and the second sub word line,
   wherein a gate of the switching transistor is connected to the main word line.

2. The semiconductor device of claim 1, further comprising:
   a first N-type transistor electrically connected between the first sub word line and a ground; and
   a second N-type transistor electrically connected between the second sub word line and the ground,
   wherein gates of the first N-type transistor and the second N-type transistor are connected to the main word line.

3. A semiconductor device comprising:
   a first sub word line and a second sub word line, each of which transmits an operation signal to a memory cell;
   a main word line that alternately sends the operation signal to either the first sub word line or the second sub word line;
   a switching transistor disposed between the first sub word line and the second sub word line, wherein a gate of the switching transistor is connected to the main word line,
   a first N-type transistor disposed between the first sub word line and a ground;
   a second N-type transistor disposed between the second sub word line and the ground;
   wherein gates of the first N-type transistor and the second N-type transistor are connected to the main word line,
   wherein the first N-type transistor, the second N-type transistor and the switching transistor are fowled in a rectangular active region.

4. A semiconductor device comprising:
   a first sub word line and a second sub word line, each of which transmits an operation signal to a memory cell;
   a main word line that alternately sends the operation signal to either the first sub word line or the second sub word line;
   a switching transistor disposed between the first sub word line and the second sub word line, wherein a gate of the switching transistor is connected to the main word line,
   a first N-type transistor disposed between the first sub word line and a ground;
   a second N-type transistor disposed between the second sub word line and the ground;
   wherein gates of the first N-type transistor and the second N-type transistor are connected to the main word line,
   wherein the first N-type transistor, the second N-type transistor and the switching transistor are formed in a U-shaped active region.

5. A semiconductor device comprising:
   a first P-type transistor having one end connected to a first selection signal receiving unit;
   a second P-type transistor having one end connected to a second selection signal receiving unit;
   a first N-type transistor and a second N-type transistor respectively having one end connected to a ground;
   a first sub word line having one end connected to other ends of the first P-type transistor and the first N-type transistor;
   a second sub word line having one end connected to other ends of the second P-type transistor and the second N-type transistor;
   a first switching transistor disposed between the first sub word line and the second sub word line; and
   a first main word line connected to gates of the first N-type transistor, of the second N-type transistor, of the first P-type transistor, of the second P-type transistor, and of the first switching transistor.

6. The semiconductor device of claim 5, wherein the first N-type transistor, the second N-type transistor and the first switching transistor are formed in a rectangular active region.

7. The semiconductor device of claim 5, wherein the first N-type transistor, the second N-type transistor and the first switching transistor are formed in a U-shaped active region.

8. The semiconductor device of claim 5, further comprising:
   a first N-type inhibitory transistor disposed between the first sub word line and the ground; and
   a second N-type inhibitory transistor disposed between the second sub word line and the ground.

9. The semiconductor device of claim 5, further comprising:
   a third P-type transistor having one end connected to a third selection signal receiving unit;
   a fourth P-type transistor having one end connected to a fourth selection signal receiving unit;
   a third N-type transistor and a fourth N-type transistor respectively having one end connected to the ground;
   a third sub word line having one end connected to other ends of the third P-type transistor and the third N-type transistor;
   a fourth sub word line having one end connected to other ends of the fourth P-type transistor and the fourth N-type transistor;
   a second switching transistor disposed between the third sub word line and the fourth sub word line; and
   a second main word line connected to gates of the third N-type transistor, of the fourth N-type transistor, of the third P-type transistor, of the fourth P-type transistor, and of the second switching transistor.

10. The semiconductor device of claim 9, wherein the first N-type transistor, the second N-type transistor, the third N-type transistor, the fourth N-type transistor, the first switching transistor and the second switching transistor are formed in a rectangular active region.

11. The semiconductor device of claim 9, wherein the first N-type transistor, the second N-type transistor, the third N-type transistor, the fourth N-type transistor, the first switching transistor and the second switching transistor are formed in an H-shaped active region.

12. The semiconductor device of claim 9, further comprising:
   a first decoder that receives a first strobe signal and that alternately sends an operation signal to either the first main word line or the second main word line.

13. The semiconductor device of claim 12, further comprising:
   a first selection line connected to the first selection signal receiving unit and the third selection signal receiving unit;
   a second selection line connected to the second selection signal receiving unit and the fourth selection signal receiving unit; and
   a second decoder that receives a second strobe signal and that alternately sends a selection signal to either the first selection line or the second selection line.

14. A semiconductor device comprising:
   a rectangular active region formed on a semiconductor substrate and defined by a device isolation region;
   a first access region and a second access region respectively formed at both corners of a first side surface of the semiconductor substrate;
   a third access region spaced apart from the first access region and the second access region and formed between both corners of a second side surface of the semiconductor substrate opposite to the first side surface; and
   a channel region between the first access region, the second access region and the third access region.

15. The semiconductor device of claim 14, further comprising a device isolation region that extends from the first side surface toward the second side surface by a predetermined thickness.

16. A semiconductor device comprising:
   a rectangular active region formed on a semiconductor substrate and defined by a device isolation region;
   a first access region and a second access region respectively formed at both corners of a first side surface of the semiconductor substrate;
   a third access region and a fourth access region respectively formed at both corners of a second side surface of the semiconductor substrate opposite to the first side surface;
   an integrated access region spaced apart from the first access region, from the second access region, from the third access region, from the fourth access region and formed between two side surfaces of the active region perpendicular to the first and second side surfaces;
   a first channel region between the first access region, the second access region and the integrated access region; and
   a second channel region between the third access region, the fourth access region and the integrated access region.

17. The semiconductor device of claim 16, further comprising a device isolation region that extends from one of the first side surface and second side surface toward an other of the first side surface and second side surface by a predetermined thickness.

18. A semiconductor device for coupling a signal from a word line to either of a first sub word line or a second sub word line, comprising:
   a first N-type transistor having a first N-type transistor drain region formed on a semiconductor substrate;
   a second N-type transistor having a second N-type transistor drain region formed on the semiconductor substrate;
   an N-type transistor source region formed on the semiconductor substrate, common both to the first N-type transistor and to the second N-type transistor and coupled to ground;
   a switching transistor having one of a switching transistor source or drain formed by the first N-type transistor drain region and an other of the switching transistor source or drain formed by the second N-type drain transistor region;
   an N-type transistor gate region formed between the first N-type transistor drain region, the second N-type transistor drain region and the N-type transistor source region and common to the first N-type transistor, to the second N-type transistor and to the switching transistor;
   wherein the first sub word line is on the first N-type transistor drain region, the second
sub word line on the second N-type transistor drain region, and
   wherein a signal applied to the N-type transistor gate region is selectively coupleable to the first word line or to the second word line.

* * * * *